(12) United States Patent
Lubomirsky

(10) Patent No.: US 10,541,113 B2
(45) Date of Patent: *Jan. 21, 2020

(54) CHAMBER WITH FLOW-THROUGH SOURCE

(71) Applicant: Applied Materials, Inc., Santa Clara, CA (US)

(72) Inventor: Dmitry Lubomirsky, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/291,494

(22) Filed: Mar. 4, 2019

(65) Prior Publication Data

US 2019/0198291 A1 Jun. 27, 2019

Related U.S. Application Data

(63) Continuation of application No. 15/943,208, filed on Apr. 2, 2018, now Pat. No. 10,224,180, which is a continuation of application No. 15/285,176, filed on Oct. 4, 2016, now Pat. No. 9,934,942.

(51) Int. Cl.
*H01J 37/30* (2006.01)
*H01L 21/30* (2006.01)
(Continued)

(52) U.S. Cl.
CPC ...... *H01J 37/3053* (2013.01); *H01J 37/3002* (2013.01); *H01J 37/3178* (2013.01);
(Continued)

(58) Field of Classification Search
CPC ........ H01L 21/67109; H01L 21/67069; H01L 21/6831; H01L 2924/0002;
(Continued)

(56) References Cited

U.S. PATENT DOCUMENTS 2,369,620 A 2/1945 Sullivan et al.
3,401,302 A * 9/1968 Thorpe .................... H05H 1/30
313/161
(Continued)

FOREIGN PATENT DOCUMENTS

CN 1124364 A 6/1996
CN 1847450 A 10/2006
(Continued)

*Primary Examiner* — David A Vanore
(74) *Attorney, Agent, or Firm* — Kilpatrick Townsend & Stockton LLP

(57) ABSTRACT

Described processing chambers may include a chamber housing at least partially defining an interior region of a semiconductor processing chamber. The chamber may include a showerhead positioned within the chamber housing, and the showerhead may at least partially divide the interior region into a remote region and a processing region in which a substrate can be contained. The chamber may also include an inductively coupled plasma source positioned between the showerhead and the processing region. The inductively coupled plasma source may include a conductive material within a dielectric material.

19 Claims, 9 Drawing Sheets

(51) Int. Cl.
*H01J 37/305* (2006.01)
*H01J 37/317* (2006.01)
*H01J 37/32* (2006.01)
*H01L 21/3065* (2006.01)

(52) U.S. Cl.
CPC ........ *H01J 37/321* (2013.01); *H01J 37/3244* (2013.01); *H01J 37/32119* (2013.01); *H01J 2229/882* (2013.01); *H01L 21/3065* (2013.01)

(58) Field of Classification Search
CPC ......... H01L 21/28562; H01L 21/67248; H01L 2924/00; H01L 21/2855; H01L 21/28568; H01L 21/30604; H01L 21/3065; H01L 21/30655; H01L 21/67126; H01L 21/67167; H01L 21/67178; H01L 21/6719; H01L 21/67201; H01L 21/67742; H01L 21/67751; H01L 21/6833; H01L 21/68714; H01L 21/68742; H01L 21/6875; H01L 21/76814; H01L 21/76843; H01L 21/76844; H01L 21/76846; H01L 21/76873; H01L 21/76876; H01L 21/76877; H01L 21/76879; H01L 21/76883; H01L 2221/1089; H01L 31/1824; H01L 31/202; A23L 19/115; A23L 27/30; A23L 27/32; A23L 29/231; A23L 29/238; A23L 29/256; A23L 29/27; A23L 2/60; A23L 33/21; A23L 9/12; H01J 37/321; H01J 37/32357; H01J 37/32522; H01J 37/3211; H01J 37/3244; H01J 37/32091; H01J 37/32458; H01J 37/32165; H01J 37/32082; H01J 37/32449; H01J 2237/2001; H01J 37/32174; H01J 37/32467; H01J 2237/3341; H01J 2237/3345; H01J 2237/3346; H01J 37/32119; H01J 37/32155; H01J 37/32183; H01J 37/32532; H01J 37/32541; H01J 37/32577; H01J 37/32623; H01J 37/32633; H01J 37/32642; H01J 37/32715; H01J 37/32724; H01J 37/32752; H01J 37/32862; H01J 37/32871; H01J 37/34; C23C 16/452; C23C 16/45565; C23C 16/509; C23C 16/4405; C23C 16/45514; C23C 16/45574; C23C 16/507; C23C 16/5096; C23C 16/18; C23C 16/401; C23C 16/4557; C23C 16/45572; C23C 14/046; C23C 14/35; C23C 14/358; C23C 14/54; C23C 14/566; C23C 16/0245; C23C 16/24; C23C 16/4404; C23C 16/455; C23C 16/45536; C23C 16/45542; C23C 16/45544; C23C 16/45553; C23C 16/45561; C23C 16/45563; C23C 16/45576; C23C 16/45578; C23C 16/4584; C23C 16/4586; C23C 16/46; C23C 16/505
USPC .......... 118/723 R, 723 I, 715, 719, 722, 728, 118/697, 723 E, 723 ER, 724, 725; 315/111.21, 111.31, 111.81, 117; 438/694, 729, 771, 200, 618, 680, 689, 438/758, 776, 96

See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desilets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |

(56) References Cited

U.S. PATENT DOCUMENTS

| | | | |
|---|---|---|---|
| 5,186,718 | A | 2/1993 | Tepman et al. |
| 5,188,706 | A | 2/1993 | Hori et al. |
| 5,198,034 | A | 3/1993 | deBoer et al. |
| 5,200,016 | A | 4/1993 | Namose |
| 5,203,911 | A | 4/1993 | Sricharoenchalkit et al. |
| 5,215,787 | A | 6/1993 | Homma |
| 5,217,559 | A | 6/1993 | Moslehi |
| 5,221,427 | A | 6/1993 | Koinuma et al. |
| 5,228,501 | A | 7/1993 | Tepman et al. |
| 5,231,690 | A | 7/1993 | Soma et al. |
| 5,235,139 | A | 8/1993 | Bengston et al. |
| 5,238,499 | A | 8/1993 | van de Ven et al. |
| 5,240,497 | A | 8/1993 | Shacham et al. |
| 5,248,371 | A | 9/1993 | Maher et al. |
| 5,248,527 | A | 9/1993 | Uchida et al. |
| 5,252,178 | A | 10/1993 | Moslehi |
| 5,266,157 | A | 11/1993 | Kadomura |
| 5,269,881 | A | 12/1993 | Sekiya |
| 5,270,125 | A | 12/1993 | America et al. |
| 5,271,972 | A | 12/1993 | Kwok et al. |
| 5,275,977 | A | 1/1994 | Otsubo et al. |
| 5,277,750 | A | 1/1994 | Wolgang |
| 5,279,669 | A | 1/1994 | Lee |
| 5,279,865 | A | 1/1994 | Chebi et al. |
| 5,288,518 | A | 2/1994 | Homma |
| 5,290,382 | A | 3/1994 | Zarowin et al. |
| 5,290,383 | A | 3/1994 | Koshimizu |
| 5,292,370 | A | 3/1994 | Tsai et al. |
| 5,292,682 | A | 3/1994 | Stevens et al. |
| 5,300,463 | A | 4/1994 | Cathey et al. |
| 5,302,233 | A | 4/1994 | Kim et al. |
| 5,304,250 | A | 4/1994 | Sameshima et al. |
| 5,306,530 | A | 4/1994 | Strongin et al. |
| 5,314,724 | A | 5/1994 | Tsukune et al. |
| 5,319,247 | A | 6/1994 | Matsuura |
| 5,326,427 | A | 7/1994 | Jerbic |
| 5,328,558 | A | 7/1994 | Kawamura et al. |
| 5,328,810 | A | 7/1994 | Lowrey et al. |
| 5,330,578 | A | 7/1994 | Sakama |
| 5,334,552 | A | 8/1994 | Homma |
| 5,345,999 | A | 9/1994 | Hosokawa |
| 5,352,636 | A | 10/1994 | Beinglass |
| 5,356,478 | A | 10/1994 | Chen et al. |
| 5,362,526 | A | 11/1994 | Wang et al. |
| 5,366,585 | A | 11/1994 | Robertson et al. |
| 5,368,897 | A | 11/1994 | Kurihara et al. |
| 5,378,316 | A | 1/1995 | Franke et al. |
| 5,380,560 | A | 1/1995 | Kaja et al. |
| 5,382,311 | A | 1/1995 | Ishikawa et al. |
| 5,384,284 | A | 1/1995 | Doan et al. |
| 5,385,763 | A | 1/1995 | Okano et al. |
| 5,399,237 | A | 3/1995 | Keswick et al. |
| 5,399,529 | A | 3/1995 | Homma |
| 5,403,434 | A | 4/1995 | Moslehi |
| 5,413,670 | A | 5/1995 | Langan et al. |
| 5,413,967 | A | 5/1995 | Matsuda et al. |
| 5,415,890 | A | 5/1995 | Kloiber et al. |
| 5,416,048 | A | 5/1995 | Blalock et al. |
| 5,420,075 | A | 5/1995 | Homma et al. |
| 5,429,995 | A | 7/1995 | Nishiyama et al. |
| 5,439,553 | A | 8/1995 | Grant et al. |
| 5,451,259 | A | 9/1995 | Krogh |
| 5,464,499 | A | 11/1995 | Moslehi |
| 5,468,342 | A | 11/1995 | Nulty et al. |
| 5,474,589 | A | 12/1995 | Ohga et al. |
| 5,478,403 | A | 12/1995 | Shinagawa et al. |
| 5,478,462 | A | 12/1995 | Walsh |
| 5,483,920 | A | 1/1996 | Pryor |
| 5,494,494 | A | 2/1996 | Mizuno et al. |
| 5,500,249 | A | 3/1996 | Telford et al. |
| 5,505,816 | A | 4/1996 | Barnes et al. |
| 5,510,216 | A | 4/1996 | Calabrese et al. |
| 5,516,367 | A | 5/1996 | Lei et al. |
| 5,518,962 | A | 5/1996 | Murao |
| 5,531,835 | A | 7/1996 | Fodor et al. |
| 5,534,070 | A | 7/1996 | Okamura et al. |
| 5,536,360 | A | 7/1996 | Nguyen et al. |
| 5,549,780 | A | 8/1996 | Koinuma et al. |
| 5,556,521 | A * | 9/1996 | Ghanbari .............. H01J 37/321 118/723 I |
| 5,558,717 | A | 9/1996 | Zhao et al. |
| 5,560,779 | A | 10/1996 | Knowles et al. |
| 5,563,105 | A | 10/1996 | Dobuzinsky et al. |
| 5,567,243 | A | 10/1996 | Foster et al. |
| 5,571,576 | A | 11/1996 | Qian et al. |
| 5,575,853 | A | 11/1996 | Arami et al. |
| 5,578,130 | A | 11/1996 | Hayashi et al. |
| 5,578,161 | A | 11/1996 | Auda |
| 5,580,385 | A * | 12/1996 | Paranjpe ............... H01J 37/321 118/723 I |
| 5,580,421 | A | 12/1996 | Hiatt et al. |
| 5,591,269 | A | 1/1997 | Arami et al. |
| 5,592,358 | A | 1/1997 | Shamouilian |
| 5,595,606 | A | 1/1997 | Fujikawa et al. |
| 5,597,439 | A | 1/1997 | Salzman |
| 5,599,740 | A | 2/1997 | Jang et al. |
| 5,614,055 | A | 3/1997 | Fairbairn et al. |
| 5,616,518 | A | 4/1997 | Foo et al. |
| 5,624,582 | A | 4/1997 | Cain |
| 5,626,922 | A | 5/1997 | Miyanaga et al. |
| 5,628,829 | A | 5/1997 | Foster et al. |
| 5,635,086 | A | 6/1997 | Warren, Jr. |
| 5,645,645 | A | 7/1997 | Zhang et al. |
| 5,648,125 | A | 7/1997 | Cane |
| 5,648,175 | A | 7/1997 | Russell et al. |
| 5,656,093 | A | 8/1997 | Burkhart et al. |
| 5,660,957 | A | 8/1997 | Chou et al. |
| 5,661,093 | A | 8/1997 | Ravi et al. |
| 5,670,066 | A | 9/1997 | Barnes et al. |
| 5,674,787 | A | 10/1997 | Zhao et al. |
| 5,676,758 | A | 10/1997 | Hasgawa et al. |
| 5,679,606 | A | 10/1997 | Wang et al. |
| 5,685,946 | A | 11/1997 | Fathauer et al. |
| 5,688,331 | A | 11/1997 | Aruga et al. |
| 5,695,810 | A | 12/1997 | Dubin et al. |
| 5,712,185 | A | 1/1998 | Tsai et al. |
| 5,716,500 | A | 2/1998 | Bardos et al. |
| 5,716,506 | A | 2/1998 | Maclay et al. |
| 5,719,085 | A | 2/1998 | Moon et al. |
| 5,733,816 | A | 3/1998 | Iyer et al. |
| 5,747,373 | A | 5/1998 | Yu |
| 5,753,886 | A | 5/1998 | Iwamura et al. |
| 5,755,859 | A | 5/1998 | Brusic et al. |
| 5,756,400 | A | 5/1998 | Ye et al. |
| 5,756,402 | A | 5/1998 | Jimbo et al. |
| 5,772,770 | A | 6/1998 | Suda et al. |
| 5,781,693 | A | 7/1998 | Balance et al. |
| 5,786,276 | A | 7/1998 | Brooks et al. |
| 5,788,825 | A | 8/1998 | Park et al. |
| 5,789,300 | A | 8/1998 | Fulford |
| 5,792,376 | A | 8/1998 | Kanai et al. |
| 5,800,686 | A | 9/1998 | Littau et al. |
| 5,804,259 | A | 9/1998 | Robles |
| 5,812,403 | A | 9/1998 | Fong et al. |
| 5,814,238 | A | 9/1998 | Ashby et al. |
| 5,814,365 | A | 9/1998 | Mahawill |
| 5,820,723 | A | 10/1998 | Benjamin et al. |
| 5,824,599 | A | 10/1998 | Schacham-Diamand et al. |
| 5,830,805 | A | 11/1998 | Schacham-Diamand et al. |
| 5,835,334 | A | 11/1998 | McMillin et al. |
| 5,843,538 | A | 12/1998 | Ehrsam et al. |
| 5,843,847 | A | 12/1998 | Pu et al. |
| 5,844,195 | A | 12/1998 | Fairbairn et al. |
| 5,846,332 | A | 12/1998 | Zhao et al. |
| 5,846,373 | A | 12/1998 | Pirkle et al. |
| 5,846,375 | A | 12/1998 | Gilchrist et al. |
| 5,846,598 | A | 12/1998 | Semkow et al. |
| 5,849,639 | A | 12/1998 | Molloy et al. |
| 5,850,105 | A | 12/1998 | Dawson et al. |
| 5,855,681 | A | 1/1999 | Maydan et al. |
| 5,855,685 | A | 1/1999 | Tobe et al. |
| 5,856,240 | A | 1/1999 | Sinha et al. |
| 5,858,876 | A | 1/1999 | Chew |

(56) References Cited

U.S. PATENT DOCUMENTS

| | | | |
|---|---|---|---|
| 5,863,376 A * | 1/1999 | Wicker | C23C 16/45565 |
| | | | 118/723 I |
| 5,865,896 A | 2/1999 | Nowak | |
| 5,866,483 A | 2/1999 | Shiau et al. | |
| 5,868,897 A | 2/1999 | Ohkawa | |
| 5,872,052 A | 2/1999 | Iyer | |
| 5,872,058 A | 2/1999 | Van Cleemput et al. | |
| 5,882,424 A | 3/1999 | Taylor et al. | |
| 5,882,786 A | 3/1999 | Nassau et al. | |
| 5,883,012 A | 3/1999 | Chiou | |
| 5,885,404 A | 3/1999 | Kim et al. | |
| 5,885,749 A | 3/1999 | Huggins et al. | |
| 5,888,906 A | 3/1999 | Sandhu et al. | |
| 5,891,349 A | 4/1999 | Tobe et al. | |
| 5,891,513 A | 4/1999 | Dubin et al. | |
| 5,897,751 A | 4/1999 | Makowiecki | |
| 5,899,752 A | 5/1999 | Hey et al. | |
| 5,900,163 A | 5/1999 | Yi et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,913,978 A | 6/1999 | Kato et al. | |
| 5,915,190 A | 6/1999 | Pirkle | |
| 5,918,116 A | 6/1999 | Chittipeddi | |
| 5,919,332 A | 7/1999 | Koshiishi et al. | |
| 5,920,792 A | 7/1999 | Lin | |
| 5,926,737 A | 7/1999 | Ameen et al. | |
| 5,928,528 A | 7/1999 | Kubota et al. | |
| 5,932,077 A | 8/1999 | Reynolds | |
| 5,933,757 A | 8/1999 | Yoshikawa et al. | |
| 5,935,334 A | 8/1999 | Fong et al. | |
| 5,935,340 A | 8/1999 | Xia et al. | |
| 5,937,323 A | 8/1999 | Orczyk et al. | |
| 5,939,831 A | 8/1999 | Fong et al. | |
| 5,942,075 A | 8/1999 | Nagahata et al. | |
| 5,944,049 A | 8/1999 | Beyer et al. | |
| 5,944,902 A | 8/1999 | Redeker et al. | |
| 5,948,702 A | 9/1999 | Rotondaro | |
| 5,951,601 A | 9/1999 | Lesinski et al. | |
| 5,951,776 A | 9/1999 | Selyutin et al. | |
| 5,951,896 A | 9/1999 | Mahawill | |
| 5,953,591 A | 9/1999 | Ishihara et al. | |
| 5,953,635 A | 9/1999 | Andideh | |
| 5,963,840 A | 10/1999 | Xia et al. | |
| 5,968,379 A | 10/1999 | Zhao et al. | |
| 5,968,587 A | 10/1999 | Frankel et al. | |
| 5,968,610 A | 10/1999 | Liu et al. | |
| 5,969,422 A | 10/1999 | Ting et al. | |
| 5,976,327 A | 11/1999 | Tanaka | |
| 5,982,100 A * | 11/1999 | Ghanbari | H01J 37/321 |
| | | | 315/111.21 |
| 5,990,000 A | 11/1999 | Hong et al. | |
| 5,990,013 A | 11/1999 | Berenguer et al. | |
| 5,993,916 A | 11/1999 | Zhao et al. | |
| 5,994,209 A | 11/1999 | Yieh et al. | |
| 5,997,649 A | 12/1999 | Hillman | |
| 5,997,962 A | 12/1999 | Ogasawara et al. | |
| 6,004,884 A | 12/1999 | Abraham | |
| 6,007,635 A | 12/1999 | Mahawill | |
| 6,007,785 A | 12/1999 | Liou | |
| 6,010,962 A | 1/2000 | Liu et al. | |
| 6,013,191 A | 1/2000 | Nasser-Faili et al. | |
| 6,013,584 A | 1/2000 | M'Saad | |
| 6,015,724 A | 1/2000 | Yamazaki et al. | |
| 6,015,747 A | 1/2000 | Lopatin et al. | |
| 6,017,414 A | 1/2000 | Koemtzopoulos et al. | |
| 6,019,848 A | 2/2000 | Kiyama et al. | |
| 6,020,271 A | 2/2000 | Yanagida | |
| 6,030,666 A | 2/2000 | Lam et al. | |
| 6,030,881 A | 2/2000 | Papasouliotis et al. | |
| 6,035,101 A | 3/2000 | Sajoto et al. | |
| 6,036,878 A * | 3/2000 | Collins | H01J 37/321 |
| | | | 216/68 |
| 6,037,018 A | 3/2000 | Jang et al. | |
| 6,037,266 A | 3/2000 | Tao et al. | |
| 6,039,834 A | 3/2000 | Tanaka et al. | |
| 6,039,851 A | 3/2000 | Iyer | |
| 6,053,982 A | 4/2000 | Halpin et al. | |
| 6,059,643 A | 5/2000 | Hu et al. | |
| 6,063,683 A | 5/2000 | Wu et al. | |
| 6,063,712 A | 5/2000 | Gilton et al. | |
| 6,065,424 A | 5/2000 | Shacham-Diamand et al. | |
| 6,065,425 A | 5/2000 | Takaki et al. | |
| 6,072,147 A | 6/2000 | Koshiishi | |
| 6,072,227 A | 6/2000 | Yau et al. | |
| 6,074,512 A * | 6/2000 | Collins | C23C 16/517 |
| | | | 118/723 AN |
| 6,074,514 A | 6/2000 | Bjorkman et al. | |
| 6,077,384 A * | 6/2000 | Collins | A21D 2/185 |
| | | | 118/723 I |
| 6,077,386 A | 6/2000 | Smith, Jr. et al. | |
| 6,077,780 A | 6/2000 | Dubin | |
| 6,079,356 A | 6/2000 | Umotoy et al. | |
| 6,080,529 A | 6/2000 | Ye et al. | |
| 6,081,414 A | 6/2000 | Flanigan et al. | |
| 6,083,344 A | 7/2000 | Hanawa et al. | |
| 6,083,844 A | 7/2000 | Bui-Le et al. | |
| 6,086,677 A | 7/2000 | Umotoy et al. | |
| 6,087,278 A | 7/2000 | Kim et al. | |
| 6,090,212 A | 7/2000 | Mahawill | |
| 6,093,457 A | 7/2000 | Okumura | |
| 6,093,594 A | 7/2000 | Yeap et al. | |
| 6,099,697 A | 8/2000 | Hausmann | |
| 6,107,199 A | 8/2000 | Allen et al. | |
| 6,110,530 A | 8/2000 | Chen et al. | |
| 6,110,832 A | 8/2000 | Morgan et al. | |
| 6,110,836 A | 8/2000 | Cohen et al. | |
| 6,110,838 A | 8/2000 | Loewenstein | |
| 6,113,771 A | 9/2000 | Landau et al. | |
| 6,114,216 A | 9/2000 | Yieh et al. | |
| 6,117,245 A | 9/2000 | Mandrekar et al. | |
| 6,120,640 A | 9/2000 | Shih et al. | |
| 6,124,003 A | 9/2000 | Mikami et al. | |
| 6,126,753 A | 10/2000 | Shinriki et al. | |
| 6,132,512 A | 10/2000 | Horie et al. | |
| 6,136,163 A | 10/2000 | Cheung et al. | |
| 6,136,165 A * | 10/2000 | Moslehi | C23C 14/046 |
| | | | 118/723 I |
| 6,136,685 A | 10/2000 | Narwankar et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,147,009 A | 11/2000 | Grill et al. | |
| 6,148,761 A | 11/2000 | Majewski et al. | |
| 6,149,828 A | 11/2000 | Vaartstra | |
| 6,150,628 A | 11/2000 | Smith et al. | |
| 6,153,935 A | 11/2000 | Edelstein et al. | |
| 6,161,500 A | 12/2000 | Kopacz et al. | |
| 6,161,576 A | 12/2000 | Maher et al. | |
| 6,162,302 A | 12/2000 | Raghavan et al. | |
| 6,162,370 A | 12/2000 | Hackett et al. | |
| 6,165,912 A | 12/2000 | McConnell et al. | |
| 6,167,834 B1 | 1/2001 | Wang et al. | |
| 6,169,021 B1 | 1/2001 | Akram et al. | |
| 6,170,428 B1 | 1/2001 | Redeker et al. | |
| 6,171,661 B1 | 1/2001 | Zheng et al. | |
| 6,174,450 B1 | 1/2001 | Patrick et al. | |
| 6,174,810 B1 | 1/2001 | Patrick et al. | |
| 6,174,812 B1 | 1/2001 | Hsuing et al. | |
| 6,176,198 B1 | 1/2001 | Kao et al. | |
| 6,176,667 B1 | 1/2001 | Fairbairn | |
| 6,177,245 B1 | 1/2001 | Ward et al. | |
| 6,179,924 B1 | 1/2001 | Zhao et al. | |
| 6,180,523 B1 | 1/2001 | Lee et al. | |
| 6,182,602 B1 | 2/2001 | Redeker et al. | |
| 6,182,603 B1 | 2/2001 | Shang et al. | |
| 6,184,121 B1 | 2/2001 | Buchwalter et al. | |
| 6,184,489 B1 | 2/2001 | Ito et al. | |
| 6,186,091 B1 | 2/2001 | Chu et al. | |
| 6,189,483 B1 | 2/2001 | Ishikawa et al. | |
| 6,190,233 B1 | 2/2001 | Hong et al. | |
| 6,194,038 B1 | 2/2001 | Rossman | |
| 6,197,181 B1 | 3/2001 | Chen | |

(56) References Cited

U.S. PATENT DOCUMENTS

| | | |
|---|---|---|
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 * | 10/2001 | Schneider ............ H01J 37/321 118/723 I |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,447,636 B1 * | 9/2002 | Qian ............... H01J 37/32009 118/723 I |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |

(56) References Cited

U.S. PATENT DOCUMENTS

| | | |
|---|---|---|
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 * | 7/2005 | Rozenzon ............ H01J 37/321 118/715 |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |

(56) References Cited

U.S. PATENT DOCUMENTS

| | | |
|---|---|---|
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 * | 7/2012 | Dhindsa ............ C23C 16/4557 118/715 |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 * | 3/2015 | Busche ............ H01J 37/32522 315/117 |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |

(56) References Cited

U.S. PATENT DOCUMENTS

| | | |
|---|---|---|
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 * | 10/2016 | Khaja ............... H01J 37/32458 |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 * | 4/2018 | Lubomirsky ...... H01J 37/32119 |
| 9,941,097 B2 * | 4/2018 | Yamazawa ............ H01J 37/321 |
| 9,947,549 B1 | 4/2018 | Park et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 10,083,830 B2 | 9/2018 | Seino et al. |
| 10,147,620 B2 | 12/2018 | Benjaminson et al. |
| 10,147,736 B2 | 12/2018 | Linuma |
| 10,224,180 B2 * | 3/2019 | Lubomirsky ...... H01J 37/32119 |
| 10,269,541 B2 * | 4/2019 | Stowell ............. H01J 37/32229 |
| 10,319,739 B2 | 6/2019 | Purayath |
| 2001/0003014 A1 | 6/2001 | Yuda |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1 | 9/2001 | Collison et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0042799 A1 | 11/2001 | Kim et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |

(56) References Cited

U.S. PATENT DOCUMENTS

| | | |
|---|---|---|
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1* | 5/2003 | Fink .................. H01J 37/321 438/200 |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura et al. |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1* | 8/2004 | Kim .................. H01J 37/321 156/345.48 |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1* | 9/2004 | Dawson ............. C23C 16/4586 118/728 |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1 | 1/2005 | Jang et al. |

(56) References Cited

U.S. PATENT DOCUMENTS

| | | |
|---|---|---|
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0145341 A1* | 7/2005 | Suzuki .................. H01J 37/321 156/345.49 |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241763 A1 | 11/2005 | Huang et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Iizuka et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |

(56) References Cited

U.S. PATENT DOCUMENTS

| | | |
|---|---|---|
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1* | 6/2007 | Ma .............. C23C 16/18 438/680 |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1* | 12/2007 | Kurita .............. C23C 14/566 414/806 |
| 2007/0281106 A1* | 12/2007 | Lubomirsky ......... C23C 16/401 427/569 |
| 2007/0284044 A1 | 12/2007 | Matsumoto et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1* | 1/2009 | Yang .............. H01J 37/32091 438/729 |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1* | 1/2009 | Fu .............. C23C 16/0245 427/569 |
| 2009/0022633 A1 | 1/2009 | Tomosue et al. |
| 2009/0036292 A1 | 2/2009 | Sun et al. |
| 2009/0045167 A1 | 2/2009 | Maruyama |
| 2009/0061640 A1 | 3/2009 | Wong et al. |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120464 A1 | 5/2009 | Rasheed et al. |
| 2009/0120582 A1 | 5/2009 | Koshimizu |
| 2009/0159213 A1 | 6/2009 | Bera et al. |
| 2009/0159588 A1 | 6/2009 | Morioka et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194508 A1 | 8/2009 | Ui et al. |
| 2009/0194810 A1 | 8/2009 | Kiyotoshi et al. |

(56) References Cited

U.S. PATENT DOCUMENTS

| | | |
|---|---|---|
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0223928 A1* | 9/2009 | Colpo ............... H01J 37/32458 216/67 |
| 2009/0226633 A1 | 9/2009 | Laflamme et al. |
| 2009/0236314 A1 | 9/2009 | Chen |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1* | 11/2009 | Lubomirsky ....... C23C 16/4405 156/345.34 |
| 2009/0277874 A1 | 11/2009 | Rui et al. |
| 2009/0280650 A1* | 11/2009 | Lubomirsky ............. B08B 7/00 438/694 |
| 2009/0286400 A1 | 11/2009 | Heo et al. |
| 2009/0286405 A1 | 11/2009 | Okesaku et al. |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0314309 A1 | 12/2009 | Sankarakrishnan et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0006543 A1 | 1/2010 | Sawada et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0213172 A1 | 8/2010 | Wilson |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1* | 9/2010 | Koshimizu ....... H01J 37/32091 216/67 |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1* | 2/2011 | Park ..................... C23C 16/401 438/771 |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1* | 5/2011 | Lubomirsky ..... H01J 37/32357 315/111.21 |
| 2011/0124144 A1 | 5/2011 | Schlemm et al. |
| 2011/0127156 A1 | 6/2011 | Foad et al. |
| 2011/0133650 A1* | 6/2011 | Kim ................... H01J 37/32091 315/111.21 |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1* | 7/2011 | Sawada ............. H01J 37/32091 216/68 |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1* | 9/2011 | Lakshmanan ........... C23C 16/24 438/96 |
| 2011/0230052 A1 | 9/2011 | Tang et al. |
| 2011/0232737 A1 | 9/2011 | Ruletzki et al. |

(56) References Cited

U.S. PATENT DOCUMENTS

| | | |
|---|---|---|
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1* | 11/2011 | Lai .................. C23C 16/45565 216/68 |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hahidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1* | 4/2013 | Volfovski .......... H01L 21/67109 165/61 |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0150303 A1 | 6/2013 | Kungl et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |

(56) References Cited

U.S. PATENT DOCUMENTS

| | | |
|---|---|---|
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0062285 A1 | 3/2014 | Chen |
| 2014/0065827 A1* | 3/2014 | Kang ................ H01J 37/3244 438/694 |
| 2014/0065842 A1 | 3/2014 | Anthis et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0124364 A1 | 5/2014 | Yoo et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1* | 7/2014 | Kumar ............... H01J 37/32357 156/345.3 |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1* | 7/2014 | Yamamoto ........ H01J 37/32091 156/345.53 |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1* | 9/2014 | Deshmukh ........ H01J 37/32715 438/714 |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2015/0007770 A1 | 1/2015 | Chandrasekharan et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1* | 4/2015 | Zope ................ H01L 21/76877 438/618 |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0167705 A1 | 6/2015 | Lee et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1* | 7/2015 | Banna ................ C23C 16/46 219/635 |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |

(56) References Cited

U.S. PATENT DOCUMENTS

| | | |
|---|---|---|
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380419 A1 | 12/2015 | Gunji-Yoneoka et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0079062 A1 | 3/2016 | Zheng et al. |
| 2016/0079072 A1 | 3/2016 | Wang et al. |
| 2016/0086772 A1* | 3/2016 | Khaja .................. H01J 37/321 315/111.21 |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0099173 A1 | 4/2016 | Agarwal et al. |
| 2016/0104606 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0358793 A1 | 12/2016 | Okumura et al. |
| 2017/0011922 A1 | 1/2017 | Tanimura et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1* | 3/2017 | Tran .................. H01J 37/3244 |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0133202 A1 | 5/2017 | Berry |
| 2017/0178894 A1 | 6/2017 | Stone et al. |
| 2017/0178899 A1 | 6/2017 | Kabansky et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0294445 A1 | 10/2017 | Son et al. |
| 2017/0309509 A1 | 10/2017 | Tran et al. |
| 2017/0338133 A1 | 11/2017 | Tan et al. |
| 2017/0338134 A1 | 11/2017 | Tan et al. |
| 2017/0373082 A1 | 12/2017 | Sekine et al. |
| 2018/0005850 A1 | 1/2018 | Citla et al. |
| 2018/0006050 A1 | 1/2018 | Watanabe et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0223437 A1 | 8/2018 | George et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0366351 A1 | 12/2018 | Lubomirsky |

FOREIGN PATENT DOCUMENTS

| | | |
|---|---|---|
| CN | 101236893 A | 8/2008 |
| CN | 101378850 A | 3/2009 |

(56) References Cited

FOREIGN PATENT DOCUMENTS

| | | |
|---|---|---|
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H08-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 A | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-019164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 2000-0008278 A | 2/2000 |
| KR | 2000-0064946 A | 11/2000 |
| KR | 2001-0056735 A | 7/2001 |
| KR | 2003-0023964 A | 3/2003 |
| KR | 2003-0054726 A | 7/2003 |
| KR | 2003-0083663 A | 10/2003 |
| KR | 100441297 B1 | 7/2004 |
| KR | 2005-0007143 A | 1/2005 |
| KR | 2005-0042701 A | 5/2005 |
| KR | 2005-0049903 A | 5/2005 |
| KR | 2006-0080509 A | 7/2006 |
| KR | 1006-41762 B1 | 11/2006 |
| KR | 2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 2008-0063988 A | 7/2008 |
| KR | 100843236 B1 | 7/2008 |
| KR | 2009-0040869 A | 4/2009 |
| KR | 2009-0128913 A | 12/2009 |
| KR | 10-2010-0013980 A | 2/2010 |
| KR | 2010-0093358 A | 8/2010 |
| KR | 2011-0086540 A | 7/2011 |
| KR | 2011-0114538 A | 10/2011 |
| KR | 2011-0126675 A | 11/2011 |
| KR | 2012-0022251 A | 3/2012 |
| KR | 2012-0082640 A | 7/2012 |
| KR | 2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A | 8/2011 |
| TW | 2012-07919 A | 2/2012 |
| TW | 2012-13594 A | 4/2012 |
| TW | 2012-33842 A | 8/2012 |
| WO | 2008-112673 A2 | 9/2008 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A2 | 3/2011 |
| WO | 2011-070945 A1 | 6/2011 |
| WO | 2011-095846 A1 | 8/2011 |
| WO | 2011-149638 A2 | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

\* cited by examiner

CHAMBER WITH FLOW-THROUGH SOURCE

CROSS-REFERENCE TO RELATED APPLICATIONS

This application is a continuation of U.S. application Ser. No. 15/943,208, filed Apr. 2, 2018, which is a continuation of U.S. application Ser. No. 15/285,176, filed Oct. 4, 2016, each of which are hereby incorporated by reference in their entirety for all purposes.

TECHNICAL FIELD

The present technology relates to semiconductor systems, processes, and equipment. More specifically, the present technology relates to processing chambers that may include an inductively coupled plasma source within the chamber.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Semiconductor processing systems and methods of the present technology may include semiconductor processing chambers including a chamber housing at least partially defining an interior region of a semiconductor processing chamber. The chamber may include a showerhead positioned within the chamber housing, and the showerhead may at least partially divide the interior region into a remote region and a processing region in which a substrate can be contained. The chamber may also include an inductively coupled plasma source positioned between the showerhead and the processing region. The inductively coupled plasma source may include a conductive material within a dielectric material.

In embodiments the dielectric material may be selected from the group consisting of aluminum oxide, yttrium oxide, single crystalline silicon, and quartz. Additionally, the conductive material may include a copper tube configured to receive a fluid flowed within the tube. The dielectric material may define apertures through the inductively coupled plasma source. In some embodiments the conductive material may be positioned about the apertures within the dielectric material. The apertures may be included in a uniform pattern across the dielectric material and about the conductive material. In some embodiments, the conductive material may be configured in a planar spiral pattern within the dielectric material. In other embodiments the conductive material may configured in a coil extending vertically within the dielectric material for at least two complete turns of the conductive material.

In exemplary plasma sources, the conductive material may include two conductive tubes positioned within the inductively coupled source. A first tube may be included in a first configuration within the inductively coupled source, and a second tube may be included in a second configuration within the inductively coupled source. In some embodiments the second configuration may be radially inward of the first configuration. The first configuration and the second configuration may each be coiled configurations extending vertically within the dielectric material. In other embodiments, the first configuration and the second configuration may each be a planar configuration within the same plane of the inductively coupled source. The first tube and the second tube may be coupled with an RF source, and in some embodiments the first tube and the second tube may each be coupled with the RF source through a capacitive divider. Additionally, in some embodiments the inductively coupled source may include at least two plates coupled together. Each plate of the at least two plates may define at least a portion of a channel, and the conductive material may be housed within the channel at least partially defined by each of the at least two plates.

The present technology also encompasses inductively coupled plasma sources. Exemplary sources may include a first plate defining at least a portion of a channel within the first plate. The first plate may include a dielectric material, for example. Exemplary sources may also include a conductive material seated within the at least a portion of the channel. In some embodiments the conductive material may be characterized by a spiral or coil configuration. Additionally, the conductive material may be coupled with an RF source and configured to generate a plasma across the source.

In some exemplary sources the first plate may define apertures through the first plate, and a central axis of each aperture may be normal to the at least a portion of the channel. In embodiments the source may be characterized by a thickness of at least three inches. The first plate may define at least a portion of the first channel and at least a portion of a second channel in embodiments. The conductive material may include at least a first conductive material seated within the at least a portion of the first channel and a second conductive material seated within the at least a portion of the second channel. Exemplary sources may further include a second plate coupled with the first plate enclosing the conductive material between the first plate and the second plate. In embodiments the second plate may define second apertures axially aligned with the apertures defined through the first plate.

The present technology additionally includes semiconductor processing chambers. Exemplary chambers may include a chamber housing at least partially defining an interior region of the semiconductor processing chamber. The chamber housing may include a lid assembly including an inlet for receiving precursors into the semiconductor processing chamber. The chambers may also include a pedestal within the interior region of the semiconductor processing chamber. The chambers may include a showerhead positioned within the chamber housing. In embodiments, the showerhead may be positioned between the lid assembly and the pedestal. Additionally, the chambers may include an inductively coupled plasma source positioned between the showerhead and the pedestal. The inductively coupled plasma source may include a conductive material within a dielectric material.

Such technology may provide numerous benefits over conventional systems and techniques. For example, inductive sources according to the present technology may reduce component sputtering from the electrodes. Additionally, plasma sources of the present technology may allow decoupling of plasma ion energy from ion density. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
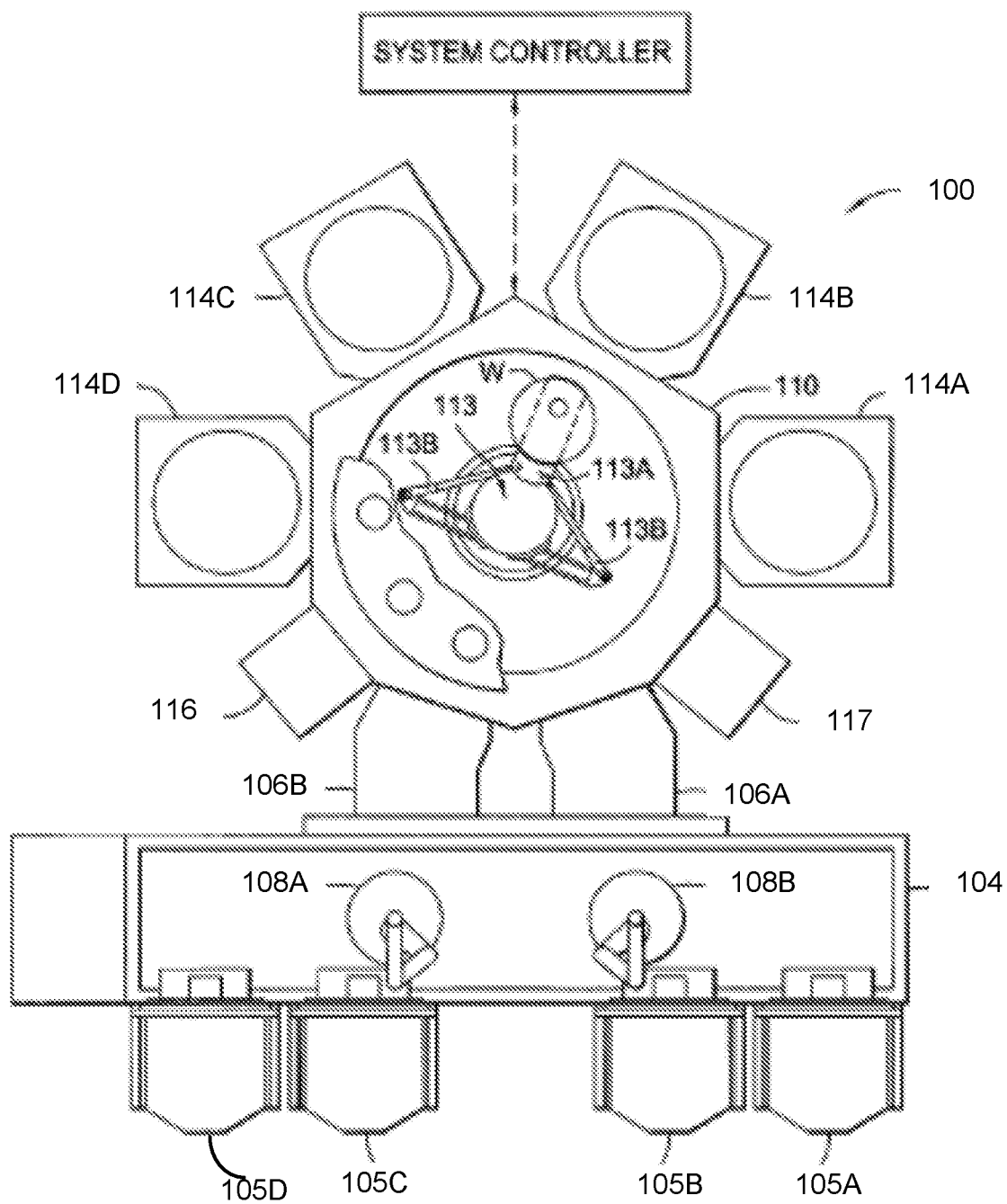
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing including tuned etch processes. Certain processing chambers available may include multiple plasma mechanisms, such as one at the wafer level as well as a remote plasma source. Plasma at the wafer level may often be formed via a capacitively-coupled plasma formed between two electrodes. One or both of these electrodes may be or include additional chamber components, such as showerheads, pedestals, or chamber walls. However, even at relatively low level plasma power and chamber pressures, such as 50 W power at 20 mTorr, the induced voltage on the electrodes may be hundreds of volts. This may cause sputtering of the electrodes themselves, which may introduce the sputtered particulate material onto the wafer. These particulates may fail to allow uniformity across the wafer, and may deposit conductive material that can cause short circuiting of the finally produced circuit.

Conventional technologies may have addressed this sputtering issue by seasoning the chamber components with a polymer coating, such as a carbon-containing coating or a silicon-containing coating. Such a polymer layer may operate as a passivation layer on the surfaces of the capacitively-coupled source electrodes. However, such a coating may be difficult to apply uniformly to a showerhead or component, may not have complete coverage, and may still be degraded over time leading to the polymeric material being deposited on the wafer.

The present technology may overcome these issues by utilizing an inductively-coupled plasma ("ICP") source within the chamber itself. The ICP source may produce voltages much lower than a capacitively-coupled plasma source of the same power, which may at least partially resolve electrode sputtering. Additionally, because the ICP source operates differently from the two plates of the capacitively-coupled source, plasma ion density and ion energy may be decoupled in exemplary chambers according to the present technology. This may allow improved plasma tuning and feature modification over conventional technologies.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone.

FIG. 1 shows a top plan view of one embodiment of a processing system 100 of deposition, etching, baking, and curing chambers according to embodiments. The processing tool 100 depicted in FIG. 1 may contain a plurality of process chambers, 114A-D, a transfer chamber 110, a service chamber 116, an integrated metrology chamber 117, and a pair of load lock chambers 106A-B. The process chambers may include structures or components similar to those described in relation to FIG. 2, as well as additional processing chambers.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within enclosure 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Figure 2:
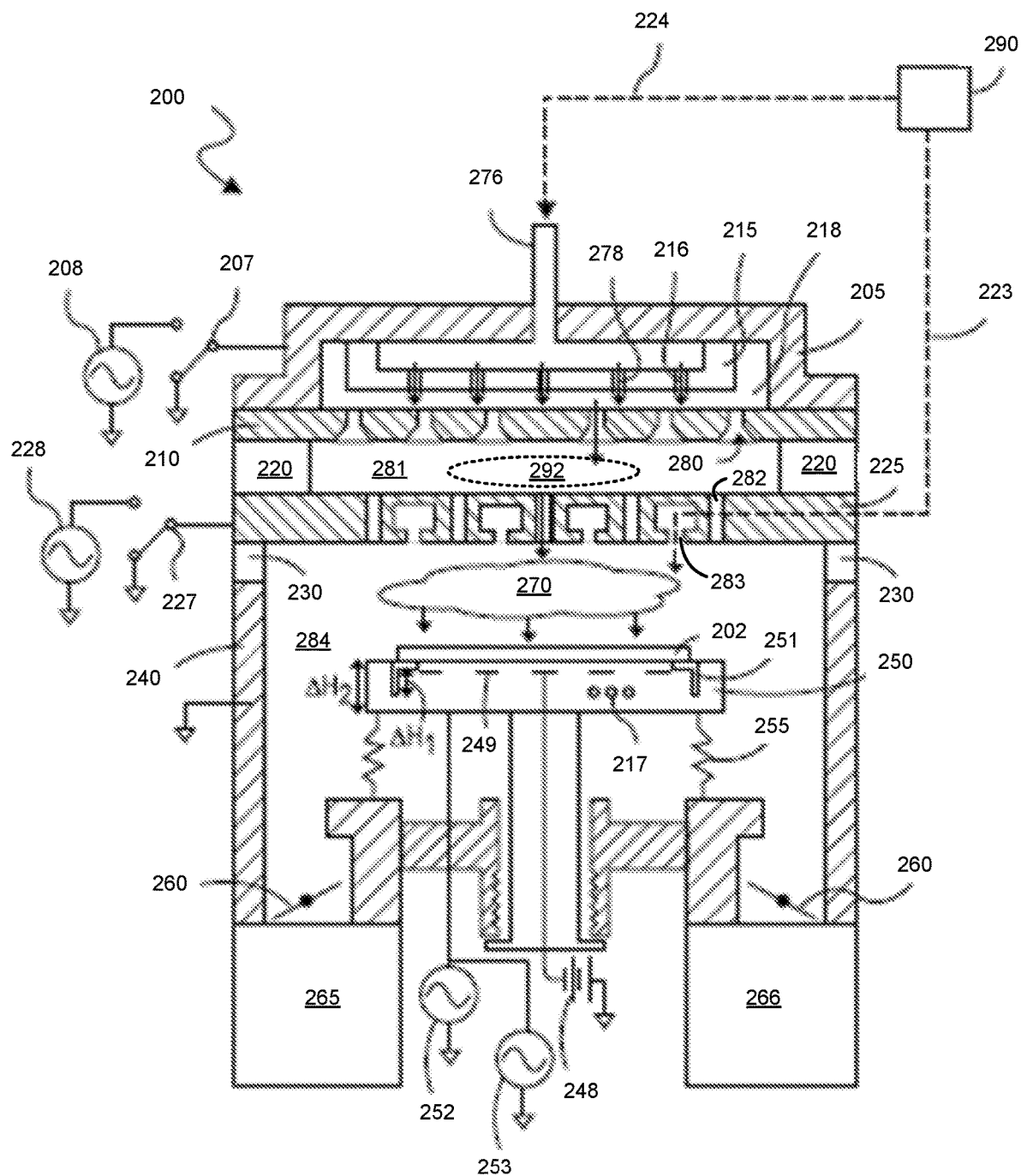
FIG. 2 shows a schematic cross-sectional view of an exemplary processing chamber according to embodiments of the present technology.

Turning now to FIG. 2 is shown a cross-sectional view of an exemplary process chamber system 200 according to the present technology. Chamber 200 may be used, for example, in one or more of the processing chamber sections 114 of the system 100 previously discussed. Generally, the etch chamber 200 may include a first capacitively-coupled plasma source to implement an ion milling operation and a second capacitively-coupled plasma source to implement an etching operation and to implement an optional deposition operation. In embodiments explained further below, the chamber may further include an inductively-coupled plasma source to perform additional ion etching operations. The chamber 200 may include grounded chamber walls 240 surrounding a chuck 250. In embodiments, the chuck 250 may be an electrostatic chuck that clamps the substrate 202 to a top surface of the chuck 250 during processing, though other clamping mechanisms as would be known may also be utilized. The chuck 250 may include an embedded heat exchanger coil 217. In the exemplary embodiment, the heat exchanger coil 217 includes one or more heat transfer fluid channels through which heat transfer fluid, such as an ethylene glycol/water mix, may be passed to control the temperature of the chuck 250 and ultimately the temperature of the substrate 202.

The chuck 250 may include a mesh 249 coupled to a high voltage DC supply 248 so that the mesh 249 may carry a DC bias potential to implement the electrostatic clamping of the substrate 202. The chuck 250 may be coupled with a first RF power source and in one such embodiment, the mesh 249 may be coupled with the first RF power source so that both the DC voltage offset and the RF voltage potentials are coupled across a thin dielectric layer on the top surface of the chuck 250. In the illustrative embodiment, the first RF power source may include a first and second RF generator 252, 253. The RF generators 252, 253 may operate at any industrially utilized frequency, however in the exemplary embodiment the RF generator 252 may operate at 60 MHz to provide advantageous directionality. Where a second RF generator 253 is also provided, the exemplary frequency may be 2 MHz.

With the chuck 250 to be RF powered, an RF return path may be provided by a first showerhead 225, which may include a dual channel showerhead. The first showerhead 225 may be disposed above the chuck to distribute a first feed gas into a first chamber region 284 defined by the first showerhead 225 and the chamber wall 240. As such, the chuck 250 and the first showerhead 225 form a first RF coupled electrode pair to capacitively energize a first plasma 270 of a first feed gas within a first chamber region 284. A DC plasma bias, or RF bias, resulting from capacitive coupling of the RF powered chuck may generate an ion flux from the first plasma 270 to the substrate 202, e.g., Ar ions where the first feed gas is Ar, to provide an ion milling plasma. The first showerhead 225 may be grounded or alternately coupled with an RF source 228 having one or more generators operable at a frequency other than that of the chuck 250, e.g., 13.56 MHz or 60 MHz. In the illustrated embodiment the first showerhead 225 may be selectably coupled to ground or the RF source 228 through the relay 227 which may be automatically controlled during the etch process, for example by a controller (not shown). In disclosed embodiments, chamber 200 may not include showerhead 225 or dielectric spacer 220, and may instead include only baffle 215 and showerhead 210 described further below.

As further illustrated in the figure, the etch chamber 200 may include a pump stack capable of high throughput at low process pressures. In embodiments, at least one turbo molecular pump 265, 266 may be coupled with the first chamber region 284 through one or more gate valves 260 and disposed below the chuck 250, opposite the first showerhead 225. The turbo molecular pumps 265, 266 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 250 may form part of a pedestal which is centered between the two turbo pumps 265 and 266, however in alternate configurations chuck 250 may be on a pedestal cantilevered from the chamber wall 240 with a single turbo molecular pump having a center aligned with a center of the chuck 250.

Disposed above the first showerhead 225 may be a second showerhead 210. In one embodiment, during processing, the first feed gas source, for example, Argon delivered from gas distribution system 290 may be coupled with a gas inlet 276, and the first feed gas flowed through a plurality of apertures 280 extending through second showerhead 210, into the second chamber region 281, and through a plurality of apertures 282 extending through the first showerhead 225 into the first chamber region 284. An additional flow distributor or baffle 215 having apertures 278 may further distribute a first feed gas flow 216 across the diameter of the etch chamber 200 through a distribution region 218. In an alternate embodiment, the first feed gas may be flowed directly into the first chamber region 284 via apertures 283 which are isolated from the second chamber region 281 as denoted by dashed line 223.

Chamber 200 may additionally be reconfigured to perform an etching operation. A secondary electrode 205 may be disposed above the first showerhead 225 with a second chamber region 281 there between. The secondary electrode 205 may further form a lid or top plate of the etch chamber 200. The secondary electrode 205 and the first showerhead 225 may be electrically isolated by a dielectric ring 220 and form a second RF coupled electrode pair to capacitively discharge a second plasma 292 of a second feed gas within the second chamber region 281. Advantageously, the second plasma 292 may not provide a significant RF bias potential on the chuck 250. At least one electrode of the second RF coupled electrode pair may be coupled with an RF source for energizing an etching plasma. The secondary electrode 205 may be electrically coupled with the second showerhead 210. In an exemplary embodiment, the first showerhead 225 may be coupled with a ground plane or floating and may be coupled to ground through a relay 227 allowing the first showerhead 225 to also be powered by the RF power source 228 during the ion milling mode of operation. Where the first showerhead 225 is grounded, an RF power source 208, having one or more RF generators operating at 13.56 MHz or 60 MHz, for example, may be coupled with the secondary electrode 205 through a relay 207 which may allow the secondary electrode 205 to also be grounded during other operational modes, such as during an ion milling operation, although the secondary electrode 205 may also be left floating if the first showerhead 225 is powered.

A second feed gas source, such as nitrogen trifluoride, and a hydrogen source, such as ammonia, may be delivered from gas distribution system 290, and coupled with the gas inlet 276 such as via dashed line 224. In this mode, the second feed gas may flow through the second showerhead 210 and may be energized in the second chamber region 281. Reactive species may then pass into the first chamber region 284 to react with the substrate 202. As further illustrated, for embodiments where the first showerhead 225 is a multi-channel showerhead, one or more feed gases may be provided to react with the reactive species generated by the second plasma 292. In one such embodiment, a water source may be coupled with the plurality of apertures 283. Additional configurations may also be based on the general illustration provided, but with various components reconfigured. For example, flow distributor or baffle 215 may be a plate similar to the second showerhead 210, and may be positioned between the secondary electrode 205 and the second showerhead 210.

As any of these plates may operate as an electrode in various configurations for producing plasma, one or more annular or other shaped spacer may be positioned between one or more of these components, similar to dielectric ring 220. Second showerhead 210 may also operate as an ion suppression plate in embodiments, and may be configured to reduce, limit, or suppress the flow of ionic species through the second showerhead 210, while still allowing the flow of neutral and radical species. One or more additional showerheads or distributors may be included in the chamber between first showerhead 225 and chuck 250. Such a showerhead may take the shape or structure of any of the distribution plates or structures previously described. Also, in embodiments a remote plasma unit (not shown) may be coupled with the gas inlet to provide plasma effluents to the chamber for use in various processes.

In an embodiment, the chuck 250 may be movable along the distance H2 in a direction normal to the first showerhead 225. The chuck 250 may be on an actuated mechanism surrounded by a bellows 255, or the like, to allow the chuck 250 to move closer to or farther from the first showerhead 225 as a means of controlling heat transfer between the chuck 250 and the first showerhead 225, which may be at an elevated temperature of 80° C.-150° C., or more. As such, an etch process may be implemented by moving the chuck 250 between first and second predetermined positions relative to the first showerhead 225. Alternatively, the chuck 250 may include a lifter 251 to elevate the substrate 202 off a top surface of the chuck 250 by distance H1 to control heating by the first showerhead 225 during the etch process. In other embodiments, where the etch process is performed at a fixed temperature such as about 90-110° C. for example, chuck displacement mechanisms may be avoided. A system controller (not shown) may alternately energize the first and second plasmas 270 and 292 during the etching process by alternately powering the first and second RF coupled electrode pairs automatically.

The chamber 200 may also be reconfigured to perform a deposition operation. A plasma 292 may be generated in the second chamber region 281 by an RF discharge which may be implemented in any of the manners described for the second plasma 292. Where the first showerhead 225 is powered to generate the plasma 292 during a deposition, the first showerhead 225 may be isolated from a grounded chamber wall 240 by a dielectric spacer 230 so as to be electrically floating relative to the chamber wall. In the exemplary embodiment, an oxidizer feed gas source, such as molecular oxygen, may be delivered from gas distribution system 290, and coupled with the gas inlet 276. In embodiments where the first showerhead 225 is a multi-channel showerhead, any silicon-containing precursor, such as OMCTS for example, may be delivered from gas distribution system 290, and directed into the first chamber region 284 to react with reactive species passing through the first showerhead 225 from the plasma 292. Alternatively the silicon-containing precursor may also be flowed through the gas inlet 276 along with the oxidizer. Chamber 200 is included as a general chamber configuration that may be utilized for various operations discussed in reference to the present technology.

Figure 3:
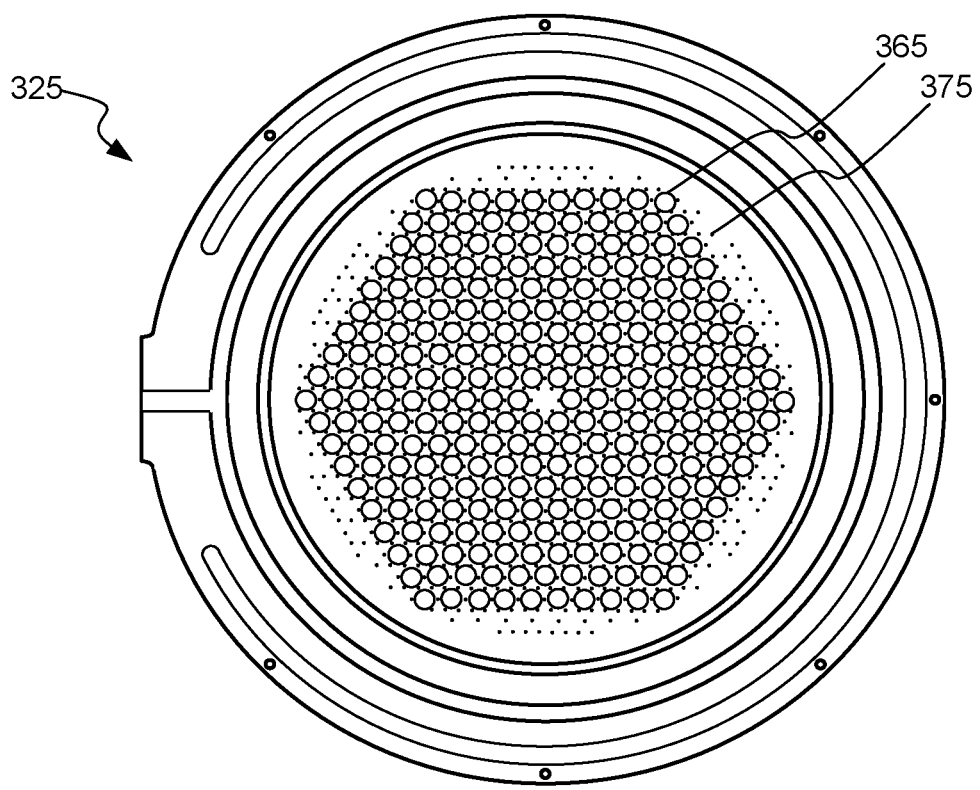
FIG. 3 shows a bottom plan view of an exemplary showerhead according to embodiments of the disclosed technology.

FIG. 3 is a bottom view of a showerhead 325 for use with a processing chamber according to embodiments. Showerhead 325 may correspond with showerhead 225 shown in FIG. 2. Through-holes 365, which may be a view of first fluid channels or apertures 282, may have a plurality of shapes and configurations in order to control and affect the flow of precursors through the showerhead 225. Small holes 375, which may be a view of second fluid channels or apertures 283, may be distributed substantially evenly over the surface of the showerhead, even amongst the through-holes 365, and may provide more even mixing of the precursors as they exit the showerhead than other configurations.

Figure 4:
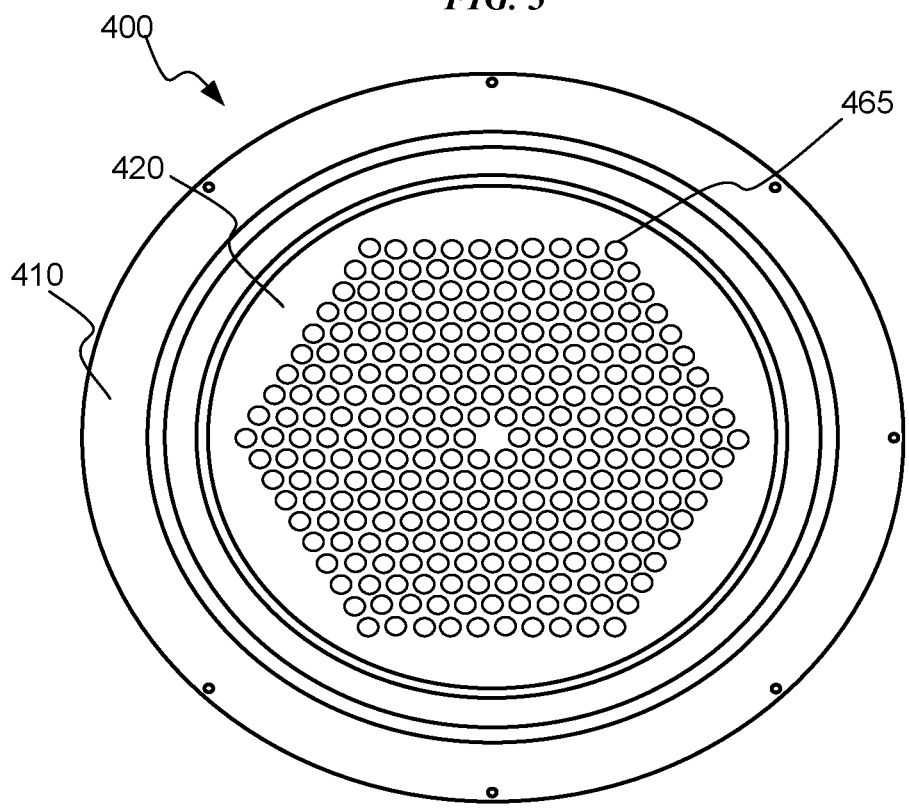
FIG. 4 shows a plan view of an exemplary faceplate according to embodiments of the disclosed technology.

An arrangement for a faceplate according to embodiments is shown in FIG. 4. As shown, the faceplate 400 may include a perforated plate or manifold. The assembly of the faceplate may be similar to the showerhead as shown in FIG. 3, or may include a design configured specifically for distribution patterns of precursor gases. Faceplate 400 may include an annular frame 410 positioned in various arrangements within an exemplary processing chamber, such as the chamber as shown in FIG. 2. On or within the frame may be coupled a plate 420, which may be similar in embodiments to ion suppressor plate 523 as described below. In embodiments faceplate 400 may be a single-piece design where the frame 410 and plate 420 are a single piece of material.

The plate may have a disc shape and be seated on or within the frame 410. The plate may be a conductive material such as a metal including aluminum, as well as other conductive materials that allow the plate to serve as an electrode for use in a plasma arrangement as previously described. The plate may be of a variety of thicknesses, and may include a plurality of apertures 465 defined within the plate. An exemplary arrangement as shown in FIG. 4 may include a pattern as previously described with reference to the arrangement in FIG. 3, and may include a series of rings of apertures in a geometric pattern, such as a hexagon as shown. As would be understood, the pattern illustrated is exemplary and it is to be understood that a variety of patterns, hole arrangements, and hole spacing are encompassed in the design.

The apertures 465 may be sized or otherwise configured to allow fluids to be flowed through the apertures during operation. The apertures may be sized less than about 2 inches in various embodiments, and may be less than or about 1.5 inches, about 1 inch, about 0.9 inches, about 0.8 inches, about 0.75 inches, about 0.7 inches, about 0.65 inches, about 0.6 inches, about 0.55 inches, about 0.5 inches, about 0.45 inches, about 0.4 inches, about 0.35 inches, about 0.3 inches, about 0.25 inches, about 0.2 inches, about 0.15 inches, about 0.1 inches, about 0.05 inches, about 0.04 inches, about 0.035 inches, about 0.03 inches, about 0.025 inches, about 0.02 inches, about 0.015 inches, about 0.01 inches, etc. or less.

In some embodiments faceplate 400 may operate as an ion suppressor that defines a plurality of apertures throughout the structure that are configured to suppress the migration of ionically-charged species out of a chamber plasma region while allowing uncharged neutral or radical species to pass through the ion suppressor into an activated gas delivery region downstream of the ion suppressor. In embodiments, the ion suppressor may be a perforated plate with a variety of aperture configurations. These uncharged species may include highly reactive species that are transported with less reactive carrier gas through the apertures. As noted above, the migration of ionic species through the holes may be reduced, and in some instances completely suppressed. For example, the aspect ratio of the holes, or the hole diameter to length, and/or the geometry of the holes may be controlled so that the flow of ionically-charged species in the activated gas passing through the ion suppressor is reduced.

Figure 5:
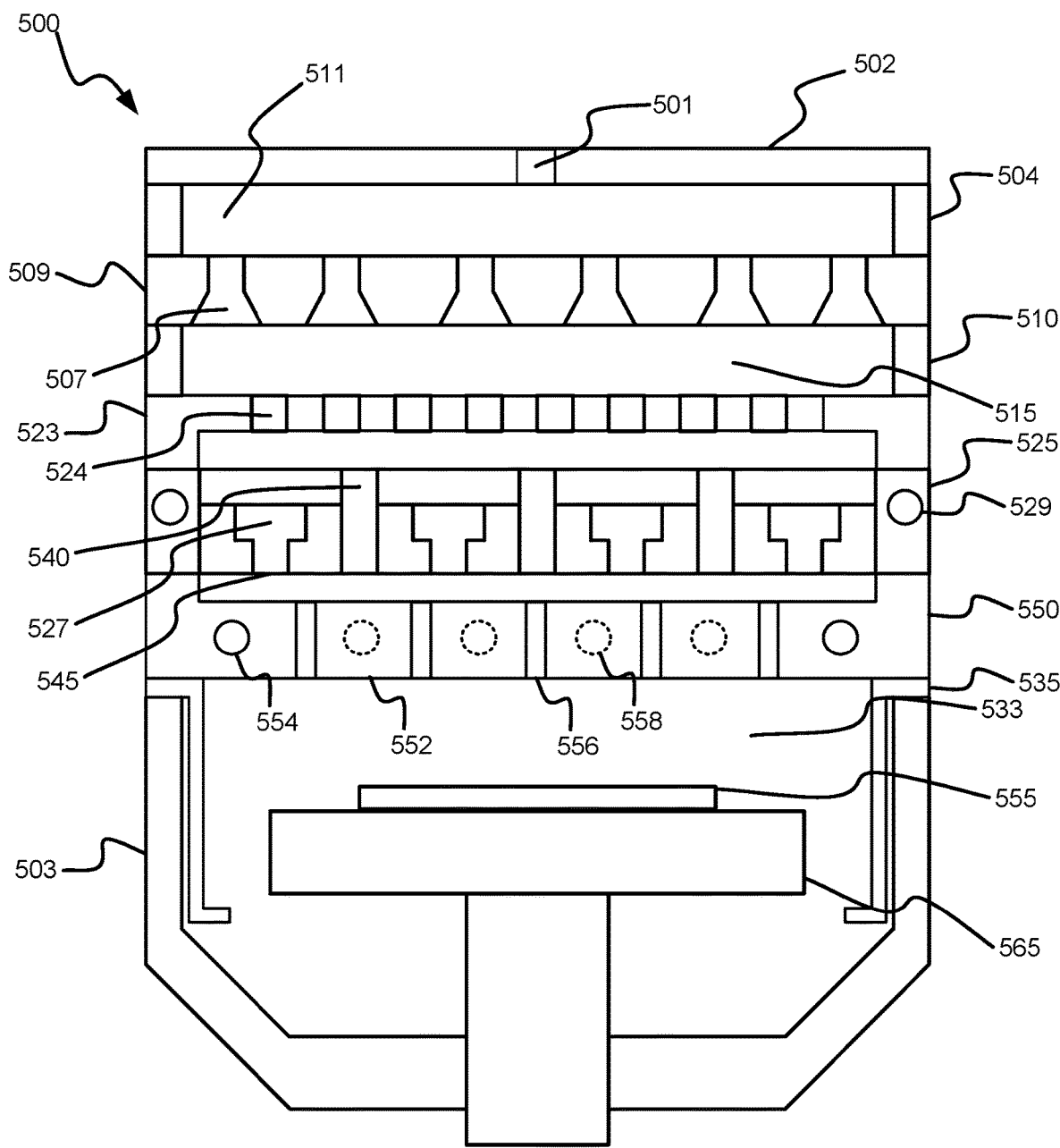
FIG. 5 shows a cross-sectional view of a processing chamber according to embodiments of the present technology.

Turning to FIG. 5 is shown a simplified schematic of processing system 500 according to the present technology. The chamber of system 500 may include any of the components as previously discussed with relation to FIGS. 2-4, and may be configured to house a semiconductor substrate 555 in a processing region 533 of the chamber. The chamber housing 503 may at least partially define an interior region of the chamber. For example, the chamber housing 503 may include lid 502, and may at least partially include any of the other plates or components illustrated in the figure. For example, the chamber components may be included as a series of stacked components with each component at least partially defining a portion of chamber housing 503. The substrate 555 may be located on a pedestal 565 as shown. Processing chamber 500 may include a remote plasma unit (not shown) coupled with inlet 501. In other embodiments, the system may not include a remote plasma unit.

With or without a remote plasma unit, the system may be configured to receive precursors or other fluids through inlet 501, which may provide access to a mixing region 511 of the processing chamber. The mixing region 511 may be separate from and fluidly coupled with the processing region 533 of the chamber. The mixing region 511 may be at least partially defined by a top of the chamber of system 500, such as chamber lid 502 or lid assembly, which may include an inlet assembly for one or more precursors, and a distribution device, such as faceplate 509 below. Faceplate 509 may be similar to the showerhead or faceplate illustrated in FIG. 4 in disclosed embodiments. Faceplate 509 may include a plurality of channels or apertures 507 that may be positioned and/or shaped to affect the distribution and/or residence time of the precursors in the mixing region 511 before proceeding through the chamber.

For example, recombination may be affected or controlled by adjusting the number of apertures, size of the apertures, or configuration of apertures across the faceplate 509. Spacer 504, such as a ring of dielectric material may be positioned between the top of the chamber and the faceplate 509 to further define the mixing region 511. Additionally, spacer 504 may be metallic to allow electrical coupling of lid 502 and faceplate 509. Additionally, spacer 504 may not be included, and either lid 502 or faceplate 509 may be characterized by extensions or raised features to separate the two plates to define mixing region 511. As illustrated, faceplate 509 may be positioned between the mixing region 511 and the processing region 533 of the chamber, and the faceplate 509 may be configured to distribute one or more precursors through the chamber 500.

The chamber of system 500 may include one or more of a series of components that may optionally be included in disclosed embodiments. For example although faceplate 509 is described, in some embodiments the chamber may not include such a faceplate. In disclosed embodiments, the precursors that are at least partially mixed in mixing region 511 may be directed through the chamber via one or more of the operating pressure of the system, the arrangement of the chamber components, or the flow profile of the precursors.

An additional plate or device 523 may be disposed below the faceplate 509. Plate 523 may include a similar design as faceplate 509, and may have a similar arrangement as is illustrated at FIG. 4, for example. Spacer 510 may be positioned between the faceplate 509 and plate 523, and may include a dielectric material, but may also include a conductive material allowing faceplate 509 and plate 523 to be electrically coupled in embodiments. Apertures 524 may be defined in plate 523, and may be distributed and configured to affect the flow of ionic species through the plate 523. For example, the apertures 524 may be configured to at least partially suppress the flow of ionic species directed toward the processing region 533, and may allow plate 523 to operate as an ion suppressor as previously described. The apertures 524 may have a variety of shapes including channels as previously discussed, and may include a tapered portion extending outward away from the processing region 533 in disclosed embodiments.

The chamber of system 500 optionally may further include a gas distribution assembly 525 within the chamber. The gas distribution assembly 525, which may be similar in aspects to the dual-channel showerheads as previously described, may be located within the chamber above the processing region 533, such as between the processing region 533 and the lid 502. The gas distribution assembly 525 may be configured to deliver both a first and a second precursor into the processing region 533 of the chamber. In embodiments, the gas distribution assembly 525 may at least partially divide the interior region of the chamber into a remote region and a processing region in which substrate 555 is positioned. Although the exemplary system of FIG. 5 includes a dual-channel showerhead, it is understood that alternative distribution assemblies may be utilized that maintain a precursor fluidly isolated from species introduced through inlet 501. For example, a perforated plate and tubes underneath the plate may be utilized, although other configurations may operate with reduced efficiency or not provide as uniform processing as the dual-channel showerhead as described. By utilizing one of the disclosed designs, a precursor may be introduced into the processing region 533 that is not previously excited by a plasma prior to entering the processing region 533, or may be introduced to avoid contacting an additional precursor with which it may react. Although not shown, an additional spacer may be positioned between the plate 523 and the showerhead 525, such as an annular spacer, to isolate the plates from one another. In embodiments in which an additional precursor may not be included, the gas distribution assembly 525 may have a design similar to any of the previously described components, and may include characteristics similar to the faceplate illustrated in FIG. 4.

In embodiments, gas distribution assembly 525 may include an embedded heater 529, which may include a resistive heater or a temperature controlled fluid, for example. The gas distribution assembly 525 may include an upper plate and a lower plate. The plates may be coupled with one another to define a volume 527 between the plates. The coupling of the plates may be such as to provide first fluid channels 540 through the upper and lower plates, and second fluid channels 545 through the lower plate. The formed channels may be configured to provide fluid access from the volume 527 through the lower plate, and the first fluid channels 540 may be fluidly isolated from the volume 527 between the plates and the second fluid channels 545. The volume 527 may be fluidly accessible through a side of the gas distribution assembly 525, such as channel 223 as previously discussed. The channel may be coupled with an access in the chamber separate from the inlet 501 of the chamber 500. The chamber of system 500 may also include a chamber liner 535, which may protect the walls of the chamber from plasma effluents as well as material deposition, for example. The liner may be or may include a conductive material, and in embodiments may be or include an insulative material.

In some embodiments, a plasma as described earlier may be formed in a region of the chamber defined between two or more of the components previously discussed. For example, a plasma region such as a first plasma region 515, may be formed between faceplate 509 and plate 523. Spacer 510 may maintain the two devices electrically isolated from one another in order to allow a plasma field to be formed. Faceplate 509 may be electrically charged while plate 523 may be grounded or DC biased to produce a plasma field within the region defined between the plates. The plates may additionally be coated or seasoned in order to minimize the degradation of the components between which the plasma may be formed. The plates may additionally include compositions that may be less likely to degrade or be affected including ceramics, metal oxides, or other conductive materials.

Operating a conventional capacitively-coupled plasma ("CCP") may degrade the chamber components, which may remove particles that may be inadvertently distributed on a substrate. Such particles may affect performance of devices formed from these substrates due to the metal particles that may provide short-circuiting across semiconductor substrates. However, the CCP of the disclosed technology may be operated at reduced or substantially reduced power in embodiments, and may be utilized to maintain the plasma, instead of ionizing species within the plasma region. In other embodiments the CCP may be operated to ionize precursors delivered into the region. For example, the CCP may be operated at a power level below or about 1 kW, 500 W, 250 W, 100 W, 50 W, 20 W, etc. or less. Moreover, the CCP may produce a flat plasma profile which may provide a uniform plasma distribution within the space. As such, a more uniform flow of plasma effluents may be delivered downstream to the processing region of the chamber.

The chamber of system 500 may also include an additional plasma source within the chamber housing. For example, plasma source 550 may be an inductively-coupled plasma ("ICP") source in embodiments. As illustrated, the ICP source 550 may be included between the gas distribution assembly 525 and the pedestal 565. The ICP source 550 may be positioned above the processing region 533, and may at least partially define the processing region 533 from above. The ICP source may include a combination of materials in embodiments, or may be a single material design. As a combination, ICP source 550 may include a conductive material 554 that is included within a dielectric material 552, or contained or housed within the dielectric material 552. In embodiments the dielectric material 552 may include any number of dielectric or insulative materials. For example, dielectric material 552 may be or include aluminum oxide, yttrium oxide, quartz, single crystalline silicon, or any other insulating material that may function within the processing environment. Some materials may not operate effectively as the dielectric material 552 in embodiments in which the ICP source 550 is positioned near or partially defining the processing region. Because the ICP source 550 may be exposed to one or more precursors or plasma effluents, the choice of material for the dielectric material 552 may be related to the precursors or operations to which it will be exposed.

The conductive material 554 may be any conductive material that may carry current. Conductive material 554 may include a solid material or a hollow material, such as a tube. By utilizing a tube, for example, a fluid may be flowed through the hollow structure, which may aid in cooling of the source under charge. In embodiments the conductive material 554 may be configured to receive a fluid flowed within the tube. The fluid may be water, for example, or may be any other fluid that may not impede the function of the ICP source 550 during operation. The conductive material 554 may be any conductive material that may operate effectively at varying operating conditions. In one non-limiting example, the conductive material 554 may be copper, including a copper tube, although other conductive materials such as other metals, or conductive non-metals may be used. Conductive material 554 may be included in a number of configurations as will be discussed below. In some configurations, the conductive material may be a tube, which may be wound, spiraled, or coiled within the dielectric material 552, and thus may be located throughout the dielectric material 552, including at optional locations 558, for example. The conductive material 554 may be included in a relatively uniform or uniform configuration to produce a uniform plasma across the ICP source 550, for example.

As previously noted, ICP source 550 may be positioned below the fluid delivery sources, such as gas distribution assembly 525 as well as other diffusers, faceplates, or showerheads previously discussed. When positioned above processing region 533, or proximate wafer 555, a uniform flow of materials through ICP source 550 may be desired to provide a uniform process across wafer 555. Thus, gas that has been distributed through the chamber through other showerheads may be a relatively uniform distribution upon interacting with the ICP source 550. Accordingly, ICP source 550 may operate as a showerhead or even as a final distributor before delivery into the processing region for contact with the wafer 555. ICP source 550 may be configured to maintain a uniform or relatively uniform flow of precursors and/or plasma effluents through the chamber and into the processing region 533. Embodiments of ICP sources 550 may include apertures 556 defined in the dielectric material 552 and through the ICP source 550. Several exemplary configurations are discussed in detail below. The apertures may be spaced apart from or around the conductive material 554 contained within the dielectric material 552. In some embodiments the direction of the apertures 556 may be perpendicular to the direction of the conductive material 554 within the dielectric material 552. For example, a central axis of any one or more of the apertures 556 may be normal to an axis of the conductive material 554, such as at an entrance to the ICP source 550, or to the direction of fluid flow within the conductive material 554, or to a direction of a channel defined in the dielectric material 552 in which the conductive material 554 may be seated.

A distance between ICP source 550 and gas distribution assembly 525 may be maintained to prevent or reduce a plasma from generating between the two components. The gas distribution assembly 525 may be grounded in some embodiments, and thus with a charged ICP source 550, the gas distribution assembly 525 may cause electromagnetic losses from the ICP source 550. Accordingly, a farther distance between the two components may be desired. However, as the components are spaced further apart, it may be possible to strike a plasma within the region between the two components. Accordingly, a distance between the two components may be less than or about 1 inch in embodiments to avoid striking a plasma between the two components. In some embodiments, the distance between the two components may be less than or about 0.9 inches, less than or about 0.8 inches, less than or about 0.7 inches, less than or about 0.6 inches, less than or about 0.5 inches, less than or about 0.4 inches, less than or about 0.3 inches, less than or about 0.2 inches, less than or about 0.1 inches, or less, although a distance may be maintained between the two components to ensure uniformity of flow between the two components which may have apertures that are axially aligned, or may be specifically offset from each other.

By including an ICP source 550, such as illustrated, a lower voltage may be produced than with a capacitively coupled plasma. In a capacitively-coupled plasma, the voltage induced on the electrodes may be directly proportional to the power, and thus may generate high voltages even at reduced power. For example, an exemplary capacitive source may be operated at a relatively low power level of about 50 W and at a pressure of about 20 mTorr, but may induce a voltage of 300-400 volts on the plates of the capacitive source. This may produce the sputtering previously discussed, for example. An inductively-coupled plasma source operated at the same frequency, such as ICP source 550, for example, may produce an induced voltage less than 300 volts for example, and may be less than 250 volts, less than 200 volts, less than 175 volts, less than 150 volts, less than 125 volts, less than 100 volts, less than 90 volts, less than 80 volts, less than 70 volts, less than 60 volts, less than 50 volts, or less depending on the number of turns and other parameters.

Additionally, utilizing ICP source 550 may provide an additional advantage over a capacitively-coupled source as discussed previously with respect to FIG. 2. FIG. 2 showed an exemplary chamber design according to the present technology in which a capacitively-coupled plasma was produced in region 270. A capacitively coupled plasma may utilize two electrodes, which can include, for example a showerhead as well as the wafer pedestal. Thus, ion density and ion energy at the wafer level are determined together. With an ICP source, the ion energy at the wafer level may be decoupled from the ion density of the plasma. For example, an ICP source may utilize an antenna to ionize gas, and may determine the ion density, which may be a function of power. Accordingly, an ICP source at a particular power may define the ion density of the plasma produced. The system, however, may still include the RF electrode in the pedestal, and may utilize a ground source, such as chamber walls. By utilizing an RF electrode and electrical ground separate from the antenna defining the ion density, the ion energy may be controlled separately at the wafer level by this RF bias at the wafer level. Accordingly, embodiments of the present design may provide additional control and tuning over process activities by utilizing the ICP source to determine ion density of the plasma, and then using an RF bias at the wafer or pedestal to control ion energy. Accordingly, the present system may produce a high density plasma, and also provide a low energy at the wafer level, for example, to perform intricate wafer modifications and ion etching.

Figure 6:
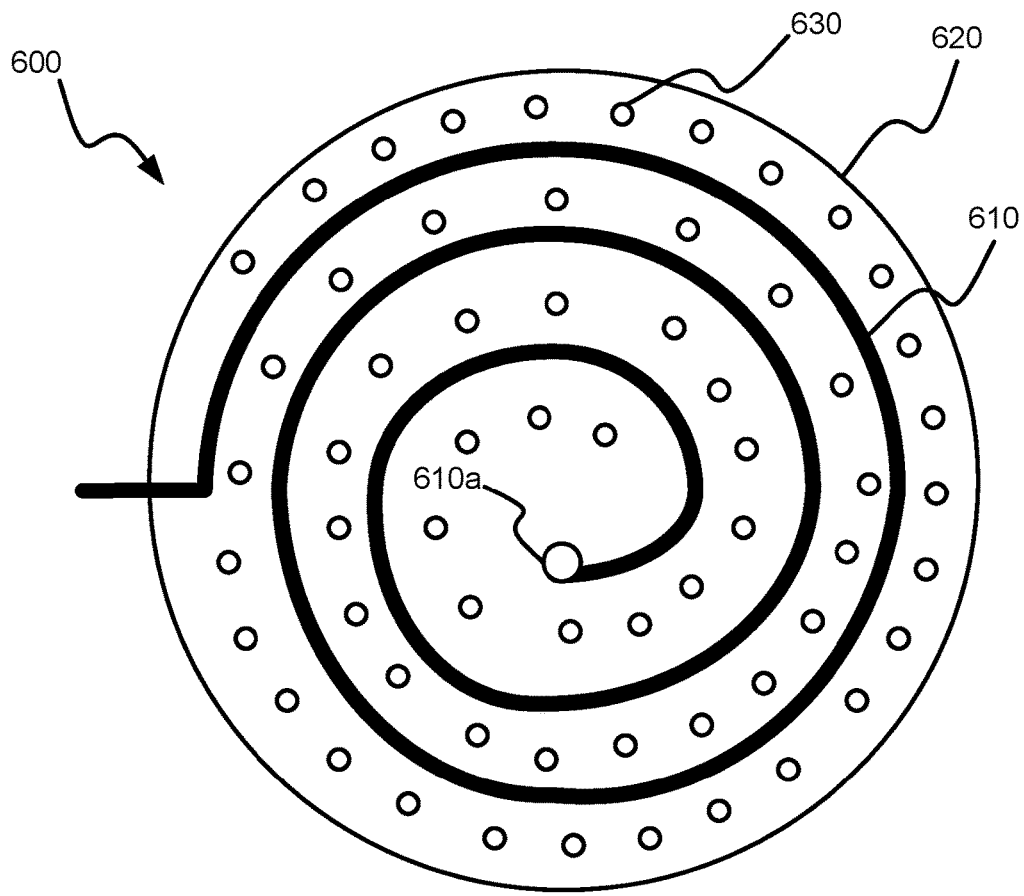
FIG. 6 shows a plan view of an exemplary plasma source according to embodiments of the present technology.

Turning to FIG. 6 is shown a plan view of an exemplary ICP source 600 according to embodiments of the present technology. As illustrated, ICP source 600 may be or include a planar source in which a conductive material 610 is configured in a two-dimensional pattern, or substantially two-dimensional pattern, within a dielectric material 620. Conductive material 610 may enter dielectric material 620 at an exterior region of the dielectric material 620. Conductive material 610 may follow a pattern based on a channel at least partially defined within or across a surface of the dielectric material 620. As illustrated, conductive material 610 may be configured in a planar coiled or spiral pattern within the dielectric material 620. ICP source 600 may include any of the materials previously described and may be incorporated in any of the exemplary chambers discussed previously or elsewhere in the disclosure.

The spiral may be included to provide a number of turns of the conductive material 610. For example, in exemplary configurations the spiral may include at least about 1 turn, and may include at least or about 2 turns, at least or about 3 turns, at least or about 4 turns, at least or about 5 turns, at least or about 6 turns, at least or about 7 turns, at least or about 8 turns or more turns depending, for example, on the size of the conductive material or dielectric material. Additionally, exemplary ICP sources may include between about 1 turn of the conductive material and about 7 turns of the conductive material, or between about 2 turns and about 4 turns. Portion 610*a* of conductive material 610 may extend vertically within the dielectric material 620, and may extend normal to the planar coil or spiral configuration of conductive material 610. As will be explained below, portion 610*a* may still be contained within the dielectric material 620 in embodiments.

The number of turns of the conductive material 610 or ICP coil may impact the power provided by the ICP source. For example, a higher number of turns of the conductive material may provide an increased power to the plasma. However, as the number of turns continues to increase, this advantage may begin to decrease. For example, as turns continue to increase, the coil may begin to compensate and induce a self-inductance, or effectively resisting itself. Accordingly, by reducing the turns below such a threshold, or minimizing the effect, as well as providing enough turns for adequate power, a balance may be established to provide acceptable ICP sources. Additionally, the configuration of the conductive material 610 may be to include similar coverage across the dielectric material 620 to provide a more uniform plasma profile through the ICP source.

ICP source 600 may also include apertures 630 defined through dielectric material 620 as previously described. The apertures may be configured to develop uniformity of a flow profile through the ICP source. In some embodiments the apertures 630 may be included in a uniform pattern across the dielectric material 620 and about the conductive material 610. As illustrated, apertures 630 are included in a spiral or coiled pattern similar to conductive material 610. Because the apertures 630 may perforate the dielectric material 620 to provide flow channels, the apertures may not be positioned in line with the conductive material. Although illustrated in a spiral pattern, the apertures may be included in additional or alternative configurations that may include a goal of providing a substantially uniform flow profile through the ICP source.

Additionally, the number of apertures 630 may be variable, and may not be adequately represented by the figure, which is included more for the pattern of apertures. The number of apertures in any pattern across the ICP source 600 may be greater than or equal to 10 apertures, greater than or equal to 50 apertures, greater than or equal to 100 apertures, greater than or equal to 500 apertures, greater than or equal to 1,000 apertures, greater than or equal to 5,000 apertures, greater than or equal to 10,000 apertures, or more depending on the size of ICP source 600 and the dimensions of the apertures. The number of apertures may also be any smaller range within these ranges, or between any two numbers included within these ranges. Similarly, the dimensions and geometries of the apertures may be similar across the ICP source 600, or may be different between apertures.

Figure 7:
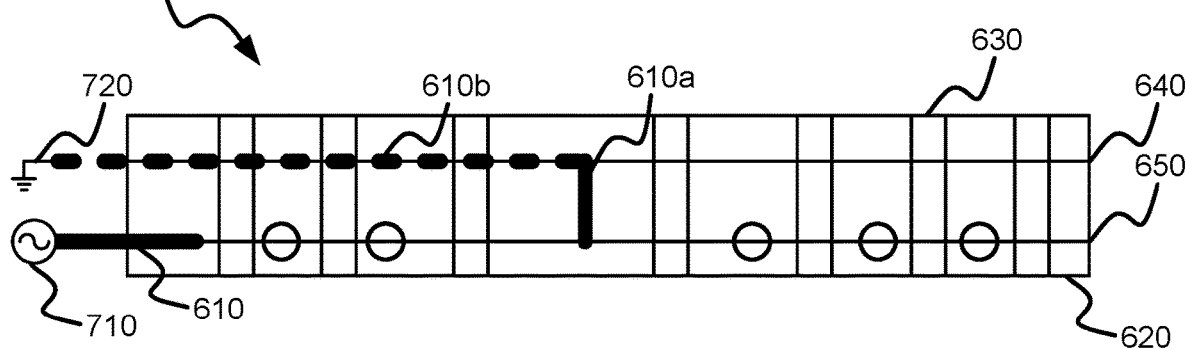
FIG. 7 shows a cross-sectional view of the exemplary plasma source of FIG. 6 according to embodiments of the present technology.

FIG. 7 shows a cross-sectional view of the exemplary ICP source 600 of FIG. 6 according to embodiments of the present technology. As illustrated, ICP source 600 may include a conductive material 610 included within a dielectric material 620. Dielectric material 620 may also define apertures 630 through the ICP source 600, and the apertures may be positioned around or about the conductive material 610. As illustrated, the cross-sectional view shows an embodiment of conductive material 610 as it both enters and exits dielectric material 620. The conductive material 610 may be coupled with a power source, such as RF power source 710 at one end of the conductive material, such as a copper tube. Additionally, the end of conductive material 610 exiting the dielectric material 620 may be coupled with electrical ground 720. In other embodiments, the conductive material 610 may include multiple sections. In order to include the conductive material 610, FIG. 7 illustrates that ICP source 600 may be thicker than one inch in embodiments, and may be between about 0.5 inches and about 3 inches in embodiments, or between about 1 inch and about 2 inches in embodiments.

FIG. 7 shows an additional view of conductive material portion 610*a*, which may extend normal to the coiled configuration of conductive material. As illustrated, portion 610*a* of conductive material may extend vertically and then exit the dielectric material 620 with section 610*b*. Section 610*b* is illustrated as hidden, as it may not be in line with the portion entering the dielectric material 620, and may not intersect any of apertures 630. As illustrated, the conductive material 610 may be completely enclosed within the dielectric material 620, except for stub portions extending from the chamber in which the source may be located and may be coupled with electrical sources. To incorporate the conductive material 610 within the dielectric material 620, the dielectric material may be cast about the conductive material, for example.

In another embodiment, the dielectric material may include a plurality of plates that each may include a portion of conductive material 610. For example, the dielectric material may include at least two plates coupled together, such as is illustrated with optional plate divisions 640, 650. As illustrated, the ICP source includes 3 plates, although additional sources may include 1 or 2 plates as well as more than 3 plates, for example. Each plate of dielectric material 620 may define at least a portion of a channel in which the conductive material may be seated in embodiments. The conductive material may then be positioned or seated within at least one plate, and then a second or additional plates may be coupled with the first plate to enclose or house the conductive material within the dielectric material 620 plates, and within the channel at least partially defined by each of the plates. Although illustrated as having the planar configuration of the conductive material within a lower plate or at a lower portion of dielectric material 620, it is to be understood that the configuration can be reversed, with the coil pattern at an upper portion of the dielectric material, and the portion 610*a* extending vertically down from the coiled portion before exiting the dielectric material 620.

Figure 8:
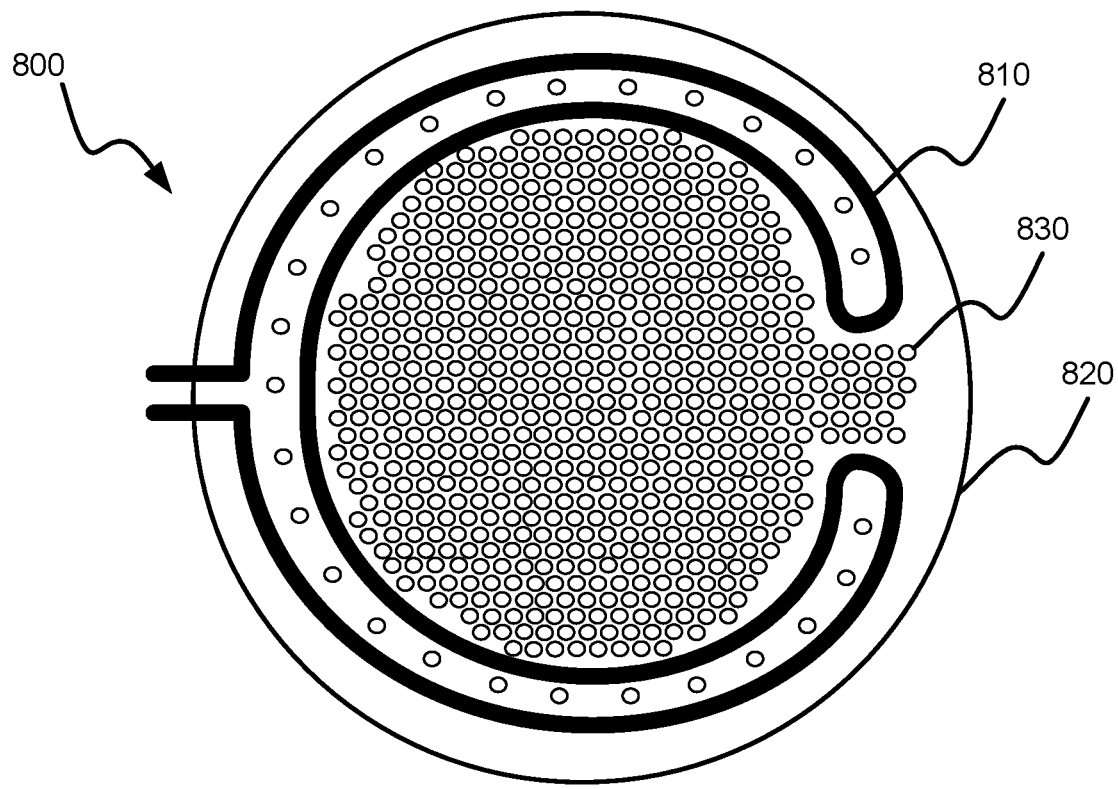
FIG. 8 shows a plan view of an exemplary plasma source according to embodiments of the present technology.

FIG. 8 shows a plan view of another exemplary plasma source 800 according to embodiments of the present technology. Plasma source 800 may include some or all of the components or characteristics previously discussed. As illustrated, plasma source 800 may include a conductive material 810 included in dielectric or insulative material 820, as previously described. Plasma source 800 may include any of the materials or configurations previously described and may be incorporated in any of the exemplary chambers discussed previously or elsewhere in this disclosure. Dielectric material 820 may additionally define a number of apertures 830 through plasma source 800, which may be positioned about or around the conductive material 810. The aperture configuration is only exemplary, and adjustments with the number, size, shape, and location of apertures will be understood to be encompassed as well. The conductive material 810 may be in a fully planar configuration as illustrated in FIG. 8, and may not include a portion extending above or below the planar configuration as was illustrated, for example, in FIGS. 6-7. In some embodiments, the dielectric material 820 may also include two dielectric plates coupled with one another that each define at least a portion of a channel in which the conductive material may be seated.

Figure 9:
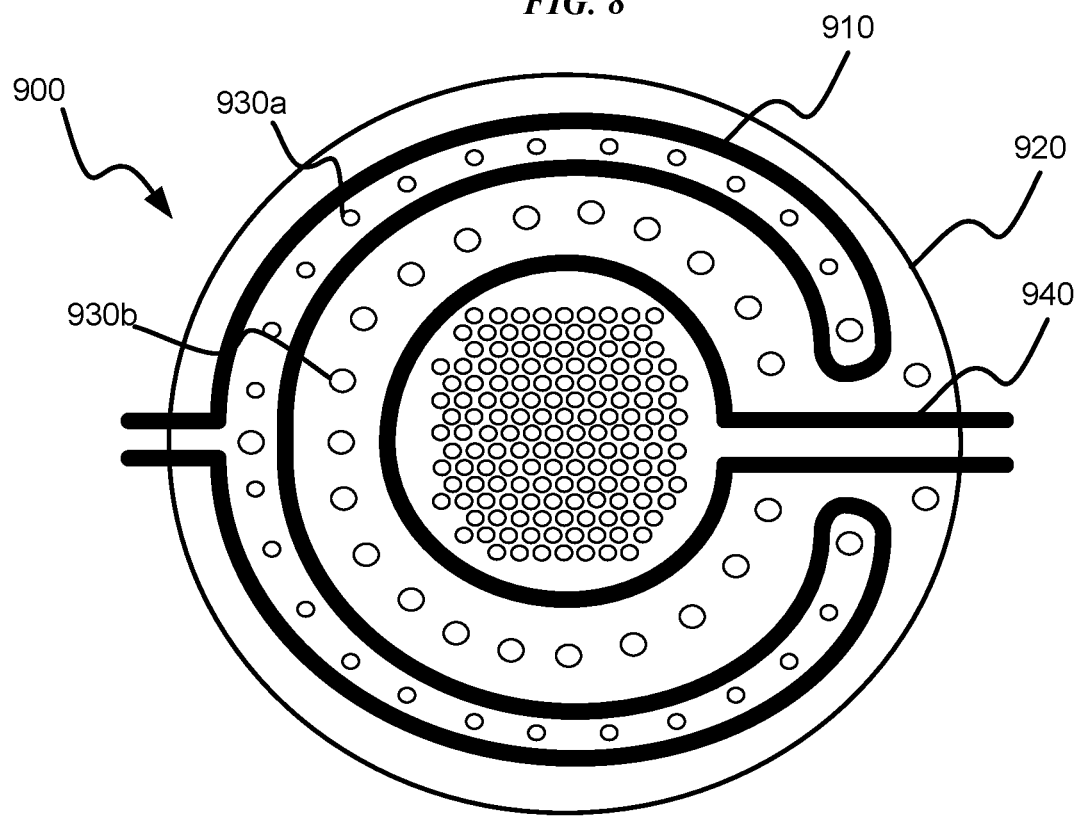
FIG. 9 shows a plan view of an exemplary plasma source according to embodiments of the present technology.

FIG. 9 shows a plan view of another exemplary plasma source 900 according to embodiments of the present technology. Plasma source 900 may include any of the materials or configurations previously described and may be incorporated in any of the exemplary chambers discussed previously or elsewhere in this disclosure. Plasma source 900 may include two conductive materials, such as conductive tubes, positioned within the plasma source. As illustrated, plasma source 900 may include two conductive materials 910, 940 included within dielectric material 920. The configuration may include a first tube 910 disposed in a first configuration within dielectric material 920. Additionally, plasma source 900 may include a second tube 940 disposed in a second configuration within dielectric material 920. The second configuration, which may include the looped portion of second tube 940, may be radially inward of the first configuration, or coiled portion, of conductive tube 910 within the dielectric material 920, or within the plasma source 900. Plasma source 900 may also include apertures 930 defined within the dielectric material 920. Apertures 930 may include any pattern as previously discussed, and may include differently sized apertures, such as smaller apertures 930a and larger apertures 930b distributed across the plasma source 900. The configuration may allow improvements in uniformity of delivery of precursors through the plasma source 900, for example.

As illustrated, the first tube 910 and the second tube 940, as well as the first configuration and the second configuration of the tubes or other conductive material, may be planar configurations. In embodiments, the first configuration and the second configuration may be within the same plane across dielectric material 920. Accordingly, the dielectric material may define at least a portion of a first channel and at least a portion of a second channel in which the two conductive materials may be seated. In other embodiments, the first configuration or first tube 910 may be on different plane of dielectric material 920 than the second configuration or second tube 940. For example, first tube 910 may be disposed vertically offset within dielectric material 920 from second tube 940.

When vertically offset, for example, the dielectric material may include three plates that each define at least a portion of a channel in which either first tube 910 or second tube 940 may be seated. A middle plate, for example, may define at least a portion of a channel in which first tube 910 is seated on a first surface of the middle plate. Additionally, the middle plate may define at least a portion of a channel in which second tube 940 is seated on a second surface of the middle plate that may be opposite the first surface. In embodiments, the first tube 910 may be covered by a first portion of dielectric material 920, and the second tube 940 may be covered by a second portion of dielectric material 920. The two portions of dielectric material may then be coupled with one another to provide the plasma source 900. In this example or any example discussed throughout the disclosure in which multiple plates may be utilized for the plasma source, the apertures may be at least partially defined through each plate of dielectric material. When coupled together, the apertures may be axially aligned.

In exemplary configurations in which two separate conductive materials or tubes are included within a dielectric material, such as with first tube 910 and second tube 940 of plasma source 900, the two materials may be individually coupled with power supplies. For example, first tube 910 may be coupled with a first RF source, and second tube 940 may be coupled with a second RF source. Additionally, the two tubes may be coupled to an RF source together. In some embodiments, the first tube and second tube may be coupled to an RF source through a capacitive divider. A capacitive divider may allow management of the ratio of energy delivered to the plasma between the two tubes by adjusting the power delivered to each of the tubes. This may allow control of the plasma density distribution. For example, tunable capacitance may allow distributions of power of 50%/50%, 40%/60%, 30%/70%, 20%/80% between the two coils, which may also then be reversed between the two coils, or any other distribution of power as would be understood to be encompassed by this configuration. Generally, whether coupled with separate RF sources operating at similar or different power levels, or an RF power with a capacitive divider, utilizing two coils may allow tuning of the plasma to adjust for uniformity of treatment operations and plasma distribution.

Figure 10:
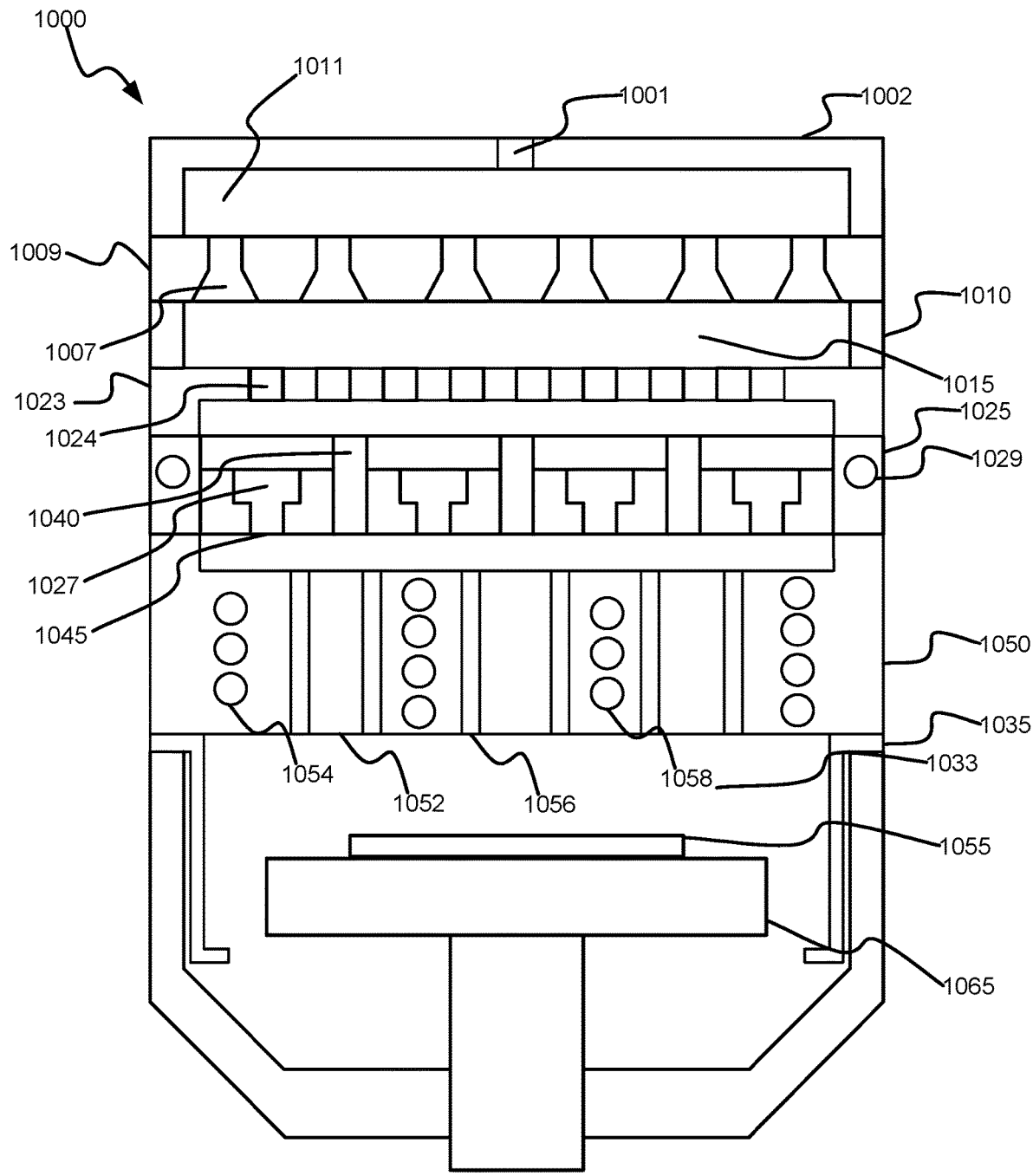
FIG. 10 shows a cross-sectional view of a processing chamber according to embodiments of the present technology.

Turning to FIG. 10 is shown a cross-sectional view of a processing chamber 1000 according to embodiments of the present technology. Chamber 1000 may include some or all of the components, materials, or configurations of chamber 200 and/or the chamber of system 500 discussed previously. For example, chamber 1000 may include a lid 1002 including an inlet 1001. Chamber 1000 may define an interior region that may be partitioned by one or more components within the chamber, such as to provide processing region 1033 in which a substrate 1055 may be positioned on a pedestal 1065. Processing region 1033 may include a liner 1035 such as previously discussed. Chamber 1000 may include a faceplate 1009 defining apertures 1007. Faceplate 1009 and lid 1002 may define a mixing region 1011 in which one or more precursors delivered to the chamber may be incorporated. Chamber 1000 may also include plate 1023 defining apertures 1024. In embodiments plate 1023 may be configured as an ion suppressor as previously discussed. A dielectric spacer 1010 may be positioned between faceplate 1009 and plate 1023. RF power may be coupled or coupleable with faceplate 1009, while plate 1023 may be coupled or coupleable with electrical ground. In embodiments, such a configuration may allow a capacitively-coupled plasma to be produced between the faceplate 1009 and the plate 1023 in region 1015.

Chamber 1000 may also include a showerhead or gas distribution assembly 1025. Gas distribution assembly 1025 may include an upper plate and a lower plate, which may be coupled with one another to define a volume 1027 between the plates. The coupling of the plates may be such as to provide first fluid channels 1040 through the upper and lower plates, and second fluid channels 1045 through the lower plate. The formed channels may be configured to provide fluid access from the volume 1027 through the lower plate, and the first fluid channels 1040 may be fluidly isolated from the volume 1027 between the plates and the second fluid channels 1045. In embodiments, gas distribution assembly 1025 may also include an embedded heater or heating element 1029.

Chamber 1000 may also include an additional plasma source, such as an inductively-coupled plasma ("ICP") source 1050. ICP source 1050 may include any of the features or characteristics of other plasma sources described elsewhere in this description. ICP source 1050 may also operate similarly to any of the previously discussed plasma sources. ICP source 1050 may include a dielectric material 1052 through which apertures 1056 may be defined. ICP source 1050 may also include a first conductive material 1054 and a second conductive material 1058 included within the dielectric material 1052. The first conductive material 1054 and second conductive material 1058 may be electrically coupled with RF power in any of the configurations discussed previously including separate sources or a single source. The arrangement of apertures 1056 about the conductive materials 1058 may be any of the configurations as previously discussed, or any other arrangement around the conductive materials. ICP source 1050 may differ from some of the planar sources previously described in that ICP source 1050 may include coiled or otherwise configured conductive material that may extend vertically within the dielectric material 1052. An exemplary configuration of an ICP source 1050 is included below with respect to FIG. 11, and will be discussed further with that figure.

Figure 11:
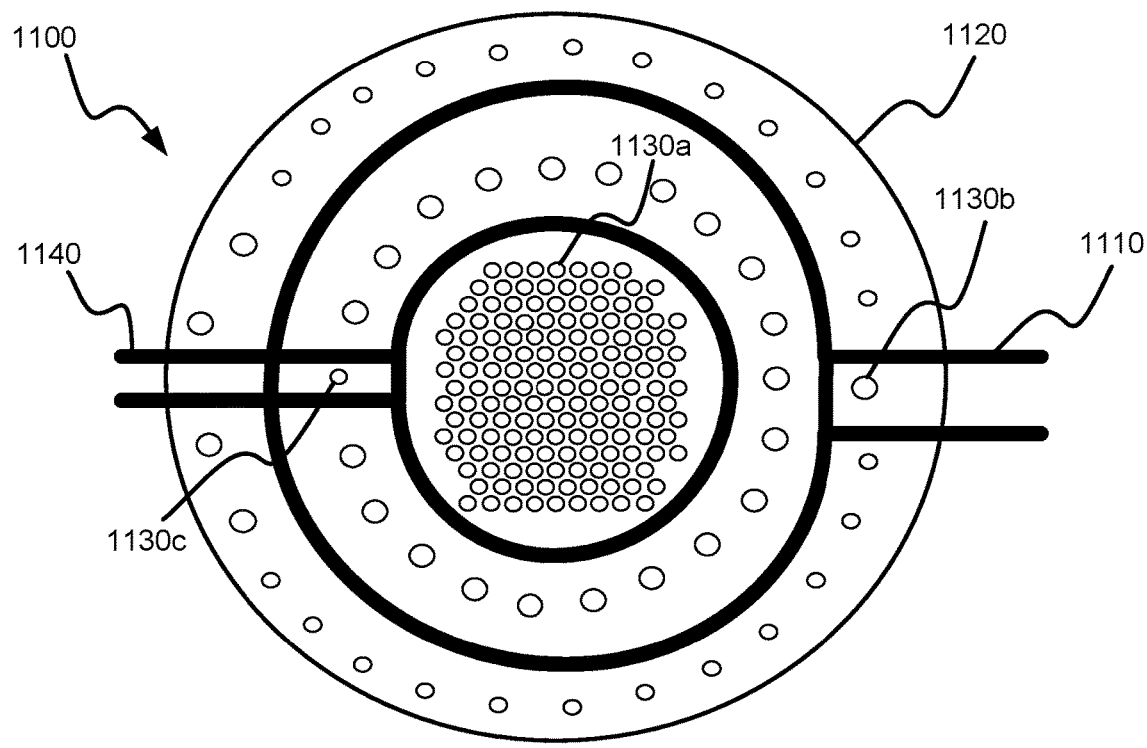
FIG. 11 shows a plan view of an exemplary plasma source according to embodiments of the present technology.

FIG. 11 shows a plan view of an exemplary plasma source 1100 according to embodiments of the present technology. As illustrated, plasma source 1100 may include a design having some similar features of any of the previously discussed designs, including FIG. 9 discussed above. Plasma source 1100 may include a first conductive material 1110 included within dielectric material 1120. Plasma source 1100 may also include a second conductive material 1140 included within dielectric material 1120. Plasma source 1100 may also include apertures 1130 defined throughout the source, which may include a variety of patterns and hole geometries to provide a uniform flow, or a relatively or substantially uniform flow of precursors or plasma effluents through plasma source 1100.

First and second conductive materials 1110, 1140 may be included in a coiled or spiraled configuration within dielectric material 1120. The coils may extend vertically within dielectric material 1120 without intersecting one another. For example, the coiled configuration of second conductive material 1140 may be radially inward of the coiled configuration of first conductive material 1110. The coils may each extend vertically in a circular fashion or in some other curved geometry for a number of turns. For example, first conductive material 1110 or second conductive material 1140 may each include at least about 1 complete turn, as well as at least about 2 complete turns, at least about 3 complete turns, at least about 4 complete turns, between about 2 complete turns and about 4 complete turns, or any other number of turns based on the spatial characteristics of the dielectric material and conductive material of the plasma source 1100.

In some embodiments the first conductive material 1110 and the second conductive material 1140 may include or be characterized by the same number of turns. In some embodiments the first or second conductive materials may include a different number of turns from one another. Additionally, in some embodiments, the first conductive material 1110 may turn in the same direction as the second conductive material 1140, while in some embodiments the first conductive material 1110 and the second conductive material 1140 may turn in opposite directions from one another, such as a left-hand turn and a right-hand turn. By having additional turns compared to some planar configurations, plasma source 1100 may provide additional plasma uniformity while providing the plasma tuning of two coils.

Figure 12:
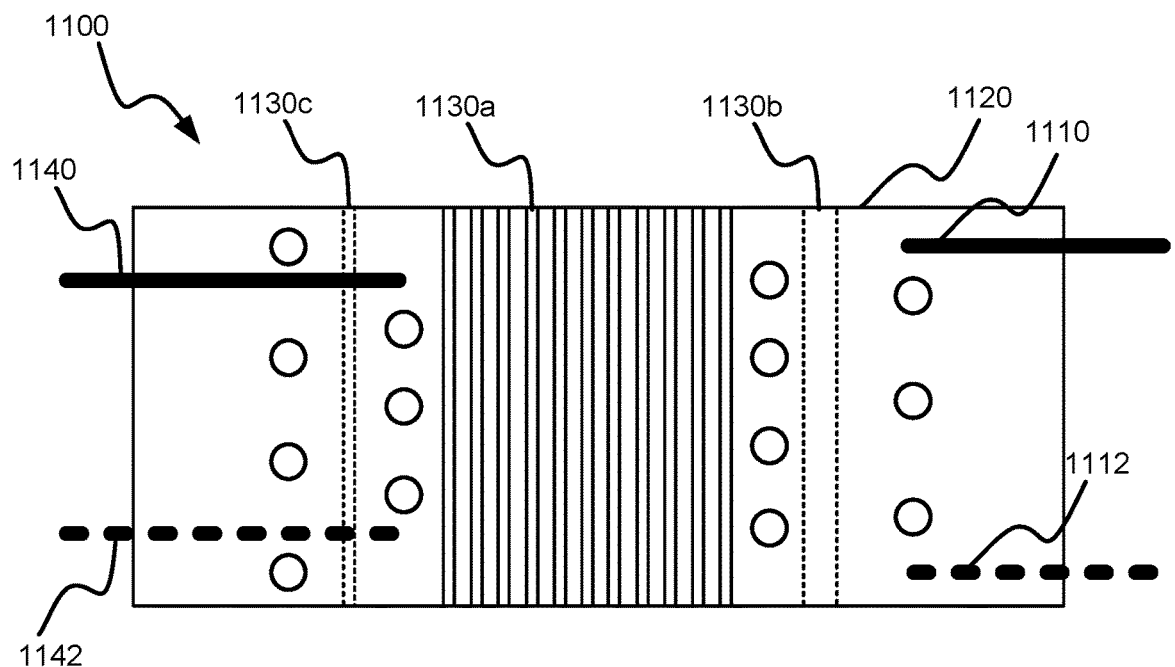
FIG. 12 shows a cross-sectional view of the exemplary plasma source of FIG. 11 according to embodiments of the present technology.

FIG. 12 shows a cross-sectional view of the exemplary plasma source of FIG. 11 according to embodiments of the present technology. As illustrated, plasma source 1100 may include a dielectric material 1120, which may include or encompass first conductive material 1110 and second conductive material 1140. Dielectric material 1120 may include any number of plates that may each define at least a portion of a channel within which first conductive material 1110 or second conductive material 1140 may reside. The dielectric material, which may include plates, may include any configuration previously described, or may be configured in additional variations that encompasses the conductive materials. Depending on the number of turns of each conductive material, plasma source 1100 may be of a thickness of at least about 2 inches in embodiments to cover the conductive materials, and may be at least about 3 inches, at least about 4 inches, at least about 5 inches, or greater in embodiments.

Conductive material 1110 and conductive material 1140 are each shown to include 4 coils extending vertically within the dielectric material 1120. The coils may be packed at any distance from adjacent coils depending on the number of coils made, the thickness of the conductive material, and the thickness of the dielectric material 1120. As illustrated, first conductive material 1110 may include end portion 1112 shown hidden, and second conductive material 1140 may include end portion 1142 shown hidden. The configuration or outlay of the tubes that may be the conductive materials may be horizontally disposed as illustrated. Because of the vertical extension of the conductive materials, in embodiments the first conductive material 1110 and/or the second conductive material 1140 may also be vertically aligned at the entrance and exit of the dielectric material 1120. Additionally, the coils of first conductive material 1110 may be spaced to allow the ingress and egress of second conductive material 1140 between the coils. As illustrated, leads or inlet and exit portions of second conductive material 1140 may pass within the coils of first conductive material 1110 without the conductive materials intersecting. The coiled configuration of second conductive material 1140 may then extend within the interior or radially inward of the coiled configuration of first conductive material 1110.

FIG. 12 additionally illustrates some apertures 1130 as may be included in cross section. For example, apertures 1130a may be centrally located within plasma source 1100, while apertures 1130b and 1130c may be radially outward from a central region of the plasma source 1100. As previously discussed, the apertures 1130 may be of a variety of sizes and geometries to assist in uniformity of flow through the plasma source 1100.

Figure 13:
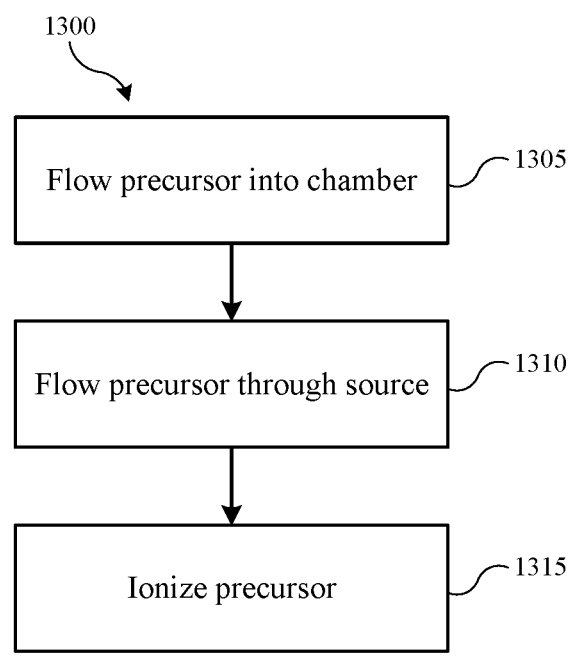
FIG. 13 shows operations of an exemplary method according to embodiments of the present technology.

The chambers and plasma sources described above may be used in one or more methods. FIG. 13 shows operations of an exemplary method 1300 according to embodiments of the present technology. The method may involve operations in an ion etching operation in which radical species may be directed to a surface of a wafer to etch or modify features on the wafer. Method 1300 may include flowing a precursor into a chamber at operation 1305. The chamber may be any of the chambers previously described, and may include one of the exemplary plasma sources, such as an ICP plasma source, as previously described. The precursor may be or include materials that may not chemically react with a surface of the wafer, and may include, for example, hydrogen, helium, argon, nitrogen, or some other precursor. The precursor may flow through the chamber to the plasma source, such as one of the ICP sources, at operation 1310. The plasma source may receive power to produce a plasma through the source, which may ionize the precursor at operation 1315 as the precursor flows through apertures defined in the source. The source may additionally operate as a showerhead to maintain or assist uniform flow of the precursor before it contacts the wafer.

In some embodiments a source, such as any of the ICP sources discussed, may also maintain plasma effluents produced elsewhere. For example, the plasma sources as described may be used to generate a plasma that may tune or further enhance plasma effluents produced in a capacitively-coupled plasma upstream of the source, or in an external source, such as a remote plasma unit. In this way precursors that may have relatively short residence times, for example, may be maintained by the ICP plasma of a source near a processing region or near the wafer level.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An inductively coupled plasma source comprising:
a plate comprising a dielectric material and at least partially defining a channel; and
a conductive material seated within the channel, wherein the conductive material is characterized by a spiral or coil configuration, wherein the conductive material is coupled with an RF source, wherein the dielectric material defines apertures through the inductively coupled plasma source, and wherein the conductive material is positioned about the apertures within the dielectric material.

2. The inductively coupled plasma source of claim 1, wherein the dielectric material is selected from the group consisting of aluminum oxide, yttrium oxide, single crystalline silicon, and quartz.

3. The inductively coupled plasma source of claim 1, wherein the conductive material comprises a copper tube configured to receive a fluid flowed within the copper tube.

4. The inductively coupled plasma source of claim 1, wherein the apertures are included in a uniform pattern about the dielectric material and about the conductive material.

5. The inductively coupled plasma source of claim 1, wherein the conductive material is configured in a planar spiral pattern within the dielectric material.

6. The inductively coupled plasma source of claim 5, wherein the conductive material enters the plate at a radial edge of the plate and extends in a constricting coil for at least two turns towards a central region of the plate.

7. The inductively coupled plasma source of claim 6, wherein the conductive material extends vertically within the plate at the central region of the plate, and exits the plate at a different elevation from where the conductive material entered the plate.

8. An inductively coupled plasma source comprising:
a first plate comprising a dielectric material and at least partially defining a channel; and
a conductive material seated within the channel, wherein the conductive material extends continuously through the dielectric material from a first position along a radial edge of the first plate where the conductive material enters the first plate to a second position along the radial edge of the first plate where the conductive material exits the first plate, and wherein the conductive material is coupled with an RF source.

9. The inductively coupled plasma source of claim 8, wherein the conductive material extends in a looped configuration through the plate.

10. The inductively coupled plasma source of claim 9, wherein the looped configuration comprises a double loop extending at least partially about a first radial length of the plate and extending at least partially about a second radial length of the plate, wherein the second radial length is less than the first radial length.

11. The inductively coupled plasma source of claim 10, wherein the conductive material transitions from the first radial length to the second radial length at a distal position in the plate from the first position at which the conductive material enters the plate.

12. The inductively coupled plasma source of claim 8, wherein the conductive material comprises a first conductive material, wherein the inductively coupled plasma source further comprises a second conductive material extending continuously through the dielectric material from a third position along a radial edge of the first plate where the second conductive material enters the first plate to a fourth position along the radial edge of the first plate where the second conductive material exits the first plate.

13. The inductively coupled plasma source of claim 12, wherein the second conductive material extends in a pattern containing a partial loop radially inward of the first conductive material.

14. The inductively coupled plasma source of claim 13, wherein the first conductive material and the second conductive material are vertically offset from one another within the plate.

15. The inductively coupled plasma source of claim 13, wherein the first conductive material and the second conductive material are each characterized by a planar configuration and are coplanar within the inductively coupled plasma source.

16. The inductively coupled plasma source of claim 13, further comprising a second plate coupled with the first plate, wherein the second plate at least partially defines the channel.

17. The inductively coupled plasma source of claim 12, wherein the first conductive material and the second conductive material are each coupled with the RF source through a capacitive divider.

18. An inductively coupled plasma source comprising:
a plate defining at least a portion of a channel within the plate, wherein the plate comprises a dielectric material; and
a conductive material seated within the at least a portion of the channel, wherein the conductive material is characterized by a spiral or coil configuration, wherein the conductive material extends continuously through the dielectric material from a first position along a radial edge of the plate where the conductive material enters the plate to a second position along the radial edge of the plate where the conductive material exits the plate, wherein the conductive material is characterized by a coil pattern extending vertically about a central axis of the plate for at least two turns, and wherein the conductive material is coupled with an RF source.

19. The inductively coupled plasma source of claim 18, wherein the conductive material comprises a first conductive material, and wherein the inductively coupled plasma source further comprises a second conductive material extending continuously through the plate without intersecting the first conductive material.

* * * * *